(12) United States Patent
Boemmels

(10) Patent No.: US 10,566,236 B2
(45) Date of Patent: Feb. 18, 2020

(54) METHOD OF FORMING VERTICAL CHANNEL DEVICES

(71) Applicant: IMEC VZW, Leuven (BE)

(72) Inventor: Juergen Boemmels, Heverlee (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/979,183

(22) Filed: May 14, 2018

(65) Prior Publication Data

US 2018/0330988 A1    Nov. 15, 2018

(30) Foreign Application Priority Data

May 15, 2017    (EP) ..................................... 17171134

(51) Int. Cl.
*H01L 29/66*    (2006.01)
*H01L 21/8238*    (2006.01)
(Continued)

(52) U.S. Cl.
CPC .. *H01L 21/76897* (2013.01); *H01L 21/31144* (2013.01); *H01L 21/76834* (2013.01);
(Continued)

(58) Field of Classification Search
CPC ......... H01L 21/76897; H01L 29/42392; H01L 29/78642; H01L 29/7827; H01L 29/66666; H01L 21/823487; H01L 21/823885

See application file for complete search history.

(56) References Cited

U.S. PATENT DOCUMENTS 5,087,581 A    2/1992   Rodder
5,382,816 A    1/1995   Mitsui
(Continued)

OTHER PUBLICATIONS

European Search Report for European Patent Office Application No. 17171134.4-1552 dated Nov. 2, 2017, in 7 pages.

*Primary Examiner* — Latanya N Crawford
(74) *Attorney, Agent, or Firm* — Knobbe, Martens, Olson & Bear LLP

(57) ABSTRACT

The disclosed technology generally relates semiconductor devices and more particularly to vertical channel devices and methods of forming the vertical channel devices. According to one aspect, a method of forming a vertical channel device includes forming on a semiconductor substrate a plurality of vertical channel structures. The method additionally includes forming gates, where each of the gates wraps around one of the vertical channel structures. The method additionally includes embedding the gates in a first dielectric layer and exposing top portions of the vertical channel structures. The method additionally includes forming top electrodes on corresponding top portions of the vertical channel structures. The method additionally includes forming sidewall etch barriers on sidewalls of each of the top electrodes. The method additionally includes forming a second dielectric layer covering the first dielectric layer and the top electrodes. The method additionally includes etching a set of vertically extending gate contact holes through the first and second dielectric layers and selectively against the sidewall etch barriers, where each of the gate contact holes exposes one of the gates adjacent to one of the top electrodes. The method further includes filling the set of gate contact holes with a conductive material. A vertical channel device fabricated using the method is also disclosed according another aspect.

11 Claims, 18 Drawing Sheets

(51) Int. Cl.
   *H01L 21/768*   (2006.01)
   *H01L 29/06*    (2006.01)
   *H01L 21/311*   (2006.01)
   *H01L 29/08*    (2006.01)
   *H01L 29/423*   (2006.01)
   *H01L 27/092*   (2006.01)
   *H01L 29/786*   (2006.01)
   *H01L 29/78*    (2006.01)
   *H01L 21/8234*  (2006.01)

(52) U.S. Cl.
   CPC ........... *H01L 21/823475* (2013.01); *H01L 21/823487* (2013.01); *H01L 21/823871* (2013.01); *H01L 21/823885* (2013.01); *H01L 27/092* (2013.01); *H01L 29/0676* (2013.01); *H01L 29/0847* (2013.01); *H01L 29/42392* (2013.01); *H01L 29/66666* (2013.01); *H01L 29/66742* (2013.01); *H01L 29/7827* (2013.01); *H01L 29/78642* (2013.01); *H01L 21/823814* (2013.01)

(56) References Cited

U.S. PATENT DOCUMENTS

| | | | |
|---|---|---|---|
| 9,530,866 B1 * | 12/2016 | Zhang | H01L 29/66666 |
| 2004/0033659 A1 | 2/2004 | Seitz et al. | |
| 2011/0012193 A1 | 1/2011 | Nojima | |
| 2017/0162446 A1 * | 6/2017 | Balakrishnan | H01L 21/82348 |
| 2017/0170287 A1 * | 6/2017 | Balakrishnan | H01L 23/5226 |

* cited by examiner

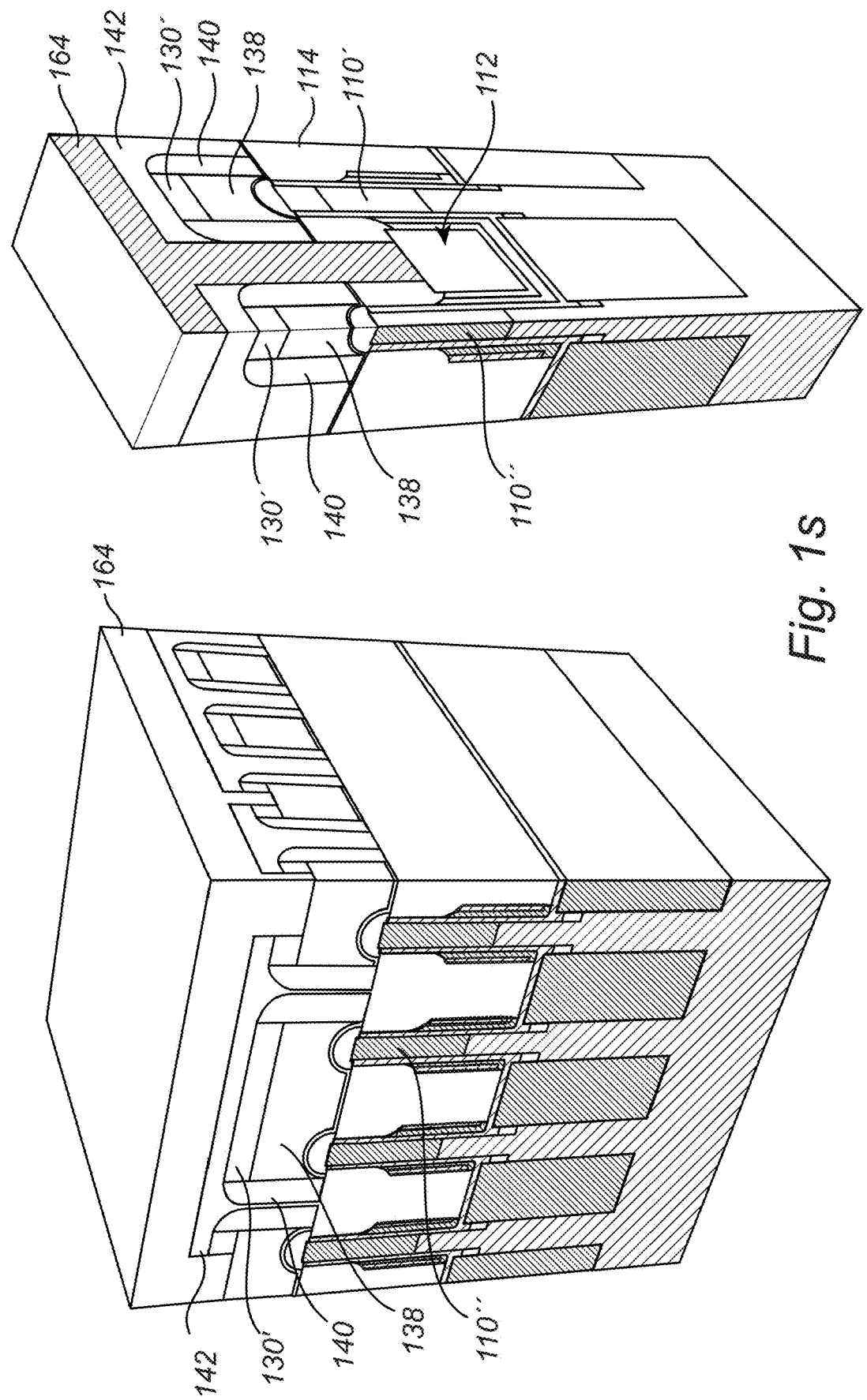

METHOD OF FORMING VERTICAL CHANNEL DEVICES

CROSS-REFERENCE TO RELATED APPLICATIONS

This application claims foreign priority to European Patent Application No. EP 17171134.4, filed May 15, 2017, the content of which is incorporated by reference herein in its entirety.

BACKGROUND

Field

The disclosed technology generally relates semiconductor devices and more particularly to vertical channel devices and methods of forming the vertical channel devices.

Description of the Related Technology

There is a general objective in the semiconductor industry to scale integrated circuit (IC) devices, e.g., by reducing the area occupied by discrete devices such as transistors, and to correspondingly increase the device density per unit area. In the constant strive to provide even more area-efficient circuit designs, new semiconductor devices are being developed. One type of area-efficient semiconductor devices is a vertical channel transistor device, e.g., as vertical nanowire field effect transistors (FETs). In vertical nanowire FETs, due to the vertically oriented channel structure, the lateral footprint occupied by the gate length does not scale with a linewidth of the gate but instead scales with the gate thickness. In addition, the source and drain regions of a vertical transistor device are vertically displaced in relation to each other. For these reasons, among others, vertical transistor devices enable dense device integrations.

To form functioning circuits, the gates and source/drains of the devices needs to be electrically contacted. However, due to the vertical orientation of the channel structures, contacting may be more challenging than contacting of horizontal channel devices. Embodiments disclosed herein address these and other challenges associated with scaling IC devices.

SUMMARY OF CERTAIN INVENTIVE ASPECTS

An objective of the disclosed technology is to address the afore-mentioned challenge. More specifically, an objective is to address top electrode formation and gate contacting for vertical channel devices. Additional and/or alternatives objectives may be understood from the following.

According to a first aspect of the disclosed technology there is provided a method for forming vertical channel devices, the method comprising: providing a semiconductor structure including a substrate and a plurality of vertical channel structures, providing the vertical channel structures with wrap-around gates, forming a first dielectric layer embedding the gates and exposing a top portion of each vertical channel structure, forming a top electrode on each top portion, forming a sidewall etch barrier on sidewalls of the top electrodes, forming a second dielectric layer covering the first dielectric layer and the top electrodes, forming a set of vertically extending gate contact holes, each hole exposing a gate and each hole being formed by etching, adjacent to a top electrode, the first and second dielectric layers selectively to the sidewall etch barrier, and filling the set of gate contact holes with a conductive material.

The inventive method aspect enables forming of gate contact portions of the conductive material filling the gate contact holes. While etching the set of gate contact holes extending through the first dielectric layer and the second dielectric layer the sidewall etch barrier on the sidewalls of the top electrodes counteracts the etching of the gate contact holes to expose sidewalls of the top electrodes.

The sidewall etch barrier enables at least a minimum amount of electrical isolation between the conductive material filling the gate contact holes and the respective adjacent top electrodes. The sidewall etch barrier hence enables formation of gate contacts which in a sense is self-aligned with respect to the top electrodes.

The sidewall etch barrier is preferably formed by a dielectric material. The sidewall etch barrier is preferably formed by a different material than the first and second dielectric layers.

The top electrodes may be formed with a horizontal dimension which is smaller than a horizontal dimension of the gates. In other words, the gates may protrude outside the top electrodes, within a horizontal plane. This enables each gate contact hole to be formed to expose a top surface of a gate.

Moreover, top electrodes contacting top source/drain portions of vertical channel structures may be formed. By the first dielectric layer embedding the gates and exposing (only) the top portions of the vertical channel structures direct electrical contact between the top electrodes and the gates may be avoided. The first dielectric layer further enables the vertical extension of the top electrodes along the vertical channel structure to be conveniently defined by controlling a thickness of the first dielectric layer.

The vertical channel devices may preferably be vertical channel transistor devices. Vertical channel transistor devices may be used to form dense memory circuitry, such as Static Random Access Memory (SRAM) bit cells, or other circuitry, such as complementary metal oxide semiconductor (CMOS) logic.

By vertical channel structure is hereby meant a semiconductor structure oriented vertically or transverse with respect to the main plane of extension of the semiconductor structure. An orientation of the channel structure may here refer to the direction of the flow of charge carriers through the structure or a longitudinal direction of the structure. The vertical channel structure is formed on a substrate, wherein (a longitudinal direction of) the "vertical" channel structures are oriented along a normal direction to (a main surface of) the substrate. The vertical channel structure may preferably be formed by a vertical "nanowire". Correspondingly, by vertical channel (transistor) device is meant a (transistor) device having a channel oriented vertically or transverse with respect to the main plane of extension of the semiconductor structure.

By a gate wrapping around a vertical channel structure, or a wrap-around gate of a vertical channel structure, is hereby meant that the gate portion completely encloses the vertical channel structure in a circumferential direction, i.e. along a vertical section of the vertical channel structure.

A gate dielectric layer may be formed between the gate the vertical channel structure.

As used herein, the term "horizontal" will be used to refer to an orientation or a direction which is transverse to the vertical direction. The semiconductor structure may include a substrate wherein a "horizontal" direction refers to a direction parallel to (a main surface of) the substrate.

The vertical channel structures may be formed on respective bottom electrode regions. By bottom electrode region is hereby meant a region forming a source or drain region with respect to a vertical channel structure. The semiconductor structure may include a substrate, wherein the respective bottom electrode regions may be formed in respective regions of the substrate.

Vertical channel structures formed on a same bottom electrode region may be electrically interconnected through the bottom electrode region.

Bottom electrode regions may be laterally spaced apart by an isolation region, for instance formed by a (bottom) dielectric layer covering the bottom electrode regions. The bottom electrode regions may accordingly be electrically isolated from each other.

By a first feature such as a layer, a level, a structure or other element, being formed "on" a second feature such as a layer, a level, a structure or other element, is hereby meant that the first feature is formed directly on the second feature, i.e. in abutment with the second feature, or with one or more layers intermediate the first and the second feature, i.e. not in direct contact with the second feature.

By a first feature such as a layer, a level, a structure or other element, being formed "above" a second feature such as a layer, a level, a structure or other element, is hereby meant that the first feature is formed above the second feature along (or as seen) in the vertical direction.

The conductive material may include a single conductive material or a combination of different materials such that the combination forms a conductive material. The conductive pattern may include a single metal or a combination of different metals. A "metal" may in this case refer to a single element metal or a mixture or an alloy of one or different single element metals.

By etching a first material or layer selectively to a second material or layer is hereby meant that the first material is etched at a rate which is greater, preferably substantially greater, than a rate at which the second material is etched. The etching of the first material or layer will hence not result in any appreciable etching of the second material or layer.

By etching or removal of a material "A", selectively to a material "B", is hereby meant that a feature of material A arranged adjacent to a feature of material B may be etched or removed while preserving the feature of material B. This may be achieved by selecting material "A" and material "B" as a combination of materials presenting different etch rates in a given etch process. The preservation of the feature of material B following the etch process may be complete (in the sense that the feature of material B not is affected appreciably during the etch process) or at least partial (in the sense that the feature of material B remains at least to the extent that it may serve its intended function during subsequent process steps).

Forming the set of gate contact holes may include: forming a gate contact mask layer on the second dielectric layer, forming openings in the gate contact mask layer, the openings defining the locations of the gate contact holes, and etching the first and second dielectric layers through the openings.

The set of gate contact holes may hence be formed using a masking and etching process.

A width dimension of at least one of said openings in the gate contact mask layer may be such that the etching through said at least one opening exposes the sidewall etch barrier layer on a top electrode (i.e. adjacent to a gate contact hole). One or more of the openings may accordingly be "oversized" without the subsequently formed gate contact portions making electrical contact with a top electrode, due to the presence of the sidewall etch barrier. This relaxes alignment requirements during forming of the openings in the gate contact mask layer.

Forming the sidewall etch barrier may include: forming a conformal etch barrier layer covering said dielectric layer and the top electrodes, and performing an anisotropic etch of said etch barrier layer such that etch barrier layer portions is removed from said dielectric layer and etch barrier layer portions remain on the sidewalls of the top electrodes.

The method may further comprise forming an upper etch barrier on the top electrodes, wherein said etching of the first and second dielectric layers includes etching the first and second dielectric layers selectively to both the sidewall etch barrier and the upper etch barrier. A risk of a gate contact hole exposing a top surface of a top electrode is hence reduced.

The upper etch barrier may be formed by a same material as the sidewall etch barrier.

The method may further comprise: forming a top electrode layer including at least a first conductive layer and covering the first dielectric layer and the top portions of the vertical channel structures, and transferring a top electrode pattern into the top electrode layer, thereby forming said top electrodes.

Top electrodes aligned with the top portions of the vertical channel structures may accordingly be conveniently formed by a pattern transfer into the top electrode layer.

The method may further comprise: forming a top electrode layer including at least a first conductive layer and covering the first dielectric layer and the top portions, forming an etch barrier layer covering the top electrode layer, and transferring a top electrode pattern into said etch barrier layer and into the top electrode layer, thereby forming said top electrodes and upper etch barriers.

Thereby top electrodes, each having a respective upper etch barrier, may be formed during the transfer of the top electrode pattern.

The top electrode layer may further include a second conductive layer formed on the first conductive layer, wherein at least the first conductive layer is formed as a conformal layer on the dielectric layer and the top portions of the vertical channel structures. A conformal conductive layer enables forming of a top electrode layer to reliably cover the top portions. The first conductive layer may provide good conductive properties with respect to the semiconductor material of the top portions. The second conductive layer may be selected to allow deposition in a relatively quick process and to have good conductive properties.

According to one embodiment transferring the top electrode pattern into the top electrode layer includes: forming a top electrode mask layer on the top electrode layer, forming the top electrode pattern in the top electrode mask layer, the top electrode pattern including a set of discrete mask portions, each mask portion of said pattern being formed to at least partially cover (or overlap) at least one top portion (as viewed) along a vertical direction, and etching the top electrode layer in regions exposed by the mask portions of the top electrode pattern such that a set of discrete top electrodes are formed.

The top electrodes may accordingly be formed to be accurately aligned with the top portions of the vertical channel structures.

By "discrete" portions, parts or other elements is hereby meant that the elements are physically separated or spaced apart to form physically disconnected elements.

The method may further comprise: subsequent to forming the additional dielectric layer, forming a set of vertically extending top contact holes, each hole exposing a top electrode and each hole being formed by etching the second dielectric layer (and also the upper etch barrier if present), and filling the set of top contact holes with the conductive material.

A set of top contact holes may hence be formed in a same layer as the set of gate contact holes. This enables forming of gate contact portions and top electrode contact portions in an efficient manner.

The method may accordingly comprise filling the set of gate contact holes and the set of top contact holes with the conductive material by forming a conductive material layer covering the second dielectric layer and filling the set of gate contact holes and the set of top contact holes.

The method may further comprise transferring a contact pattern into the conductive material layer to form a set of discrete contacts including gate contacts connected to gate below said set of gate contact holes and top contacts connected to top electrodes below said set of contact holes.

The second dielectric layer and the first dielectric layer may be formed of a same material. This may simplify the overall complexity of the process since a same deposition process may be used for forming the first and the second dielectric layers. Moreover, a same etching chemistry may be used when etching the gate contact portions extending through the first dielectric layer and the gate contact portions extending through the second dielectric layer while obtaining a uniform etching rate.

According to one embodiment, the method further comprises, prior to forming the top electrodes, growing a doped semiconductor material selectively on top portions of each of at least a subset of said vertical channel structures, thereby forming enlarged top portions. The top electrodes may thereafter be formed on each of the enlarged top portions. By growing a doped semiconductor material selectively on top portions of vertical channel structures, enlarged top portions may be formed which facilitates alignment with the top electrodes. The enlargement in combination with the doping of the semiconductor material contributes to achieving a good electrical contact between the top electrodes and the vertical channel structures.

By "selectively" growing a doped semiconductor material on top portions of vertical channel structures is hereby meant that the doped semiconductor material is grown or deposited on and in contact with the top portions of the vertical channel structures. The growth process is hence adapted such that growth on the top portions of the vertical channel structures is strongly preferred over growth on other structures.

The doped semiconductor material is preferably epitaxially grown, i.e. using an epitaxial growth process.

According to one embodiment, a first doped semiconductor material is grown selectively on top portions of a first selected subset of said vertical channel structures and a second doped semiconductor material is grown selectively on top portions of a second selected subset of said vertical channel structures. Thereby, enlarged top portions of semiconductor material doped in accordance with a desired type of device (e.g., p- or n-type) may be selectively formed.

The first semiconductor material may be doped with a first type of dopant (e.g., p-type or n-type) and the second semiconductor material is doped with a second type of dopant (e.g., n-type or p-type).

The method may further comprise: forming a first mask covering the top portions of the vertical channel structures of the second subset and exposing the top portions of the vertical channel structures of the first subset, wherein the first doped semiconductor material is grown selectively on each of the top portions exposed by the first mask, removing the first mask, and forming a second mask covering the top portions of the vertical channel structures of the first subset and exposing the top portions of the vertical channel structures of the second subset, wherein the second doped semiconductor material is grown selectively on each of the top portions exposed by the second mask.

This enables definition of which vertical channel structures should form part of the first and second subsets respectively and provides a reliable selectivity to the process.

The method may further comprise: forming a first mask layer covering the top portions of said plurality of vertical channel structures, forming a first mask patterning layer on the first mask layer, opening the first mask patterning layer in a region above the top portions of the vertical channel structures of the first subset, opening the first mask layer in a region exposed in said opening of the first mask patterning layer, wherein the opened first mask layer forms the first mask, and prior to growing the first semiconductor material, performing ion implantation of the top portions exposed by the first mask, wherein ion implantation in regions covered by the first mask is counteracted.

Performing ion implantation of the top portions exposed by the first mask further enables forming of vertical channel devices with highly doped top-side source/drain regions.

By keeping the first mask patterning layer on the first mask during the ion implantation, a multi-layered implantation mask is provided which efficiently may counteract ion implantation in covered top portions.

The first mask layer may be formed by a non-resist based mask material. The first mask layer may be formed by a hard mask material.

The first mask patterning layer may include at least a photo resist layer. The first mask patterning layer may advantageously include a stack of layers such as one or more spin-on-layers and a photo resist layer.

The first mask patterning layer may be removed subsequent to performing ion implantation and prior to growing the first semiconductor material. The first mask patterning layer may thereby not interfere with the process of growing the first doped semiconductor material.

The method may further comprise, subsequent to removing the first mask: forming a second mask layer covering the top portions of said plurality of vertical channel structures, forming a second mask patterning layer on the second mask layer, opening the second mask patterning layer in a region above the top portions of the vertical channel structures of the second subset, opening the second mask layer in a region exposed in said opening of the second mask patterning layer, wherein the opened second mask layer forms the second mask, and prior to growing the second semiconductor material, performing ion implantation of the top portions exposed by the second mask, wherein ion implantation in regions covered by the second mask is counteracted.

A similar ion implantation process may accordingly be performed also for the second subset of vertical channel structures.

The discussion regarding the first mask layer and the first mask patterning layer above applies correspondingly to the second mask layer and the second mask patterning layer The second mask patterning layer may be removed subsequent to performing ion implantation and prior to growing the second semiconductor material.

BRIEF DESCRIPTION OF THE DRAWINGS

The above, as well as additional objects, features and advantages of the disclosed technology, will be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

A method for forming vertical channel devices will now be described with reference to FIGS. 1a-1t.

Figure 1A:
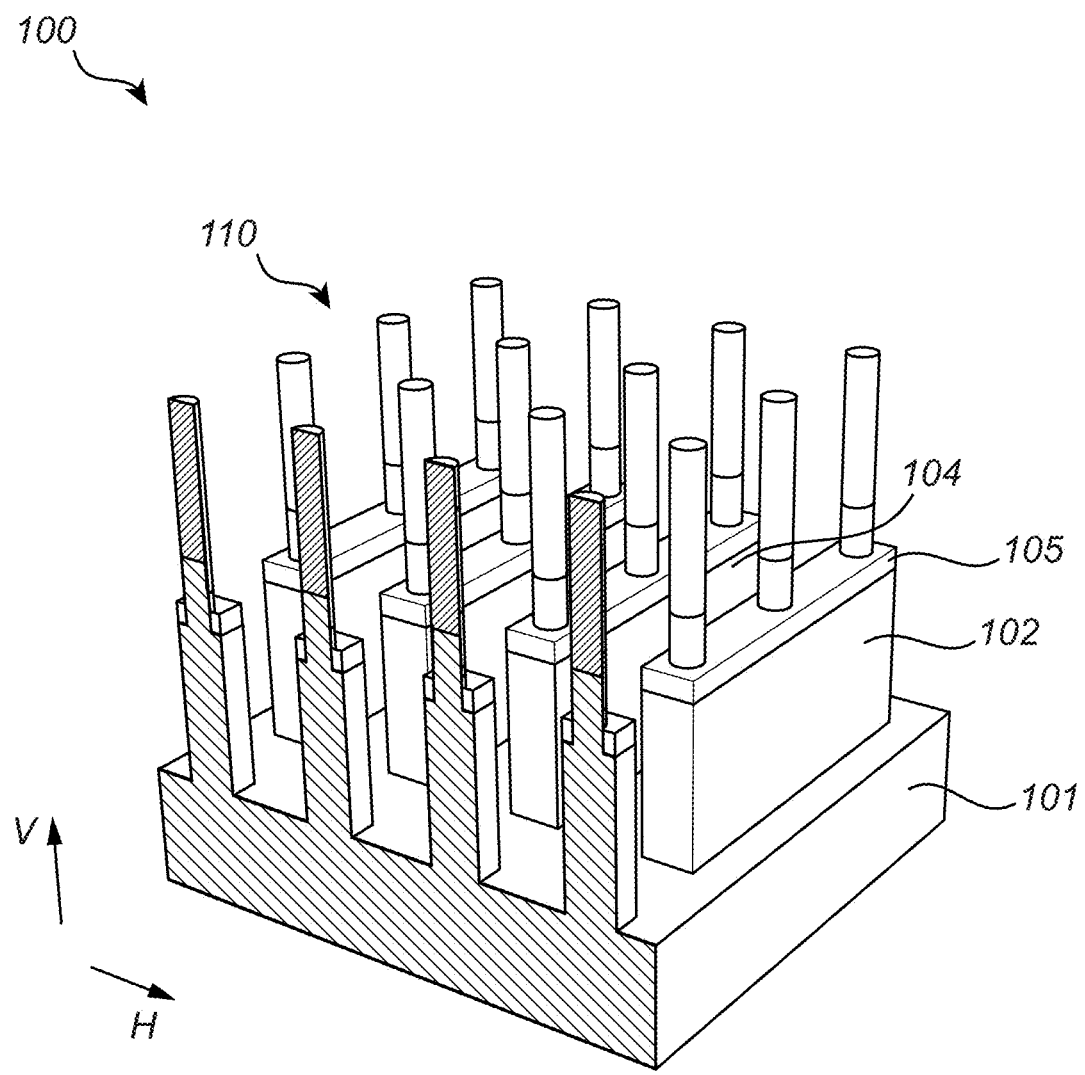
FIGS. 1a-1t illustrate a method for forming a vertical channel device, according to embodiments.

FIG. 1a shows a perspective view of a section of an intermediate semiconductor structure or intermediate device 100. It will be understood that the structure 100 may extend laterally or horizontally beyond the illustrated section. The illustrated planes of section extending through the structure 100 are common to all the Figures.

It is noted that the relative dimensions of the shown structures, for instance the relative thickness of layers, is merely schematic and may, for the purpose of illustrational clarity, differ from a physical structure.

The semiconductor structure 100 includes a semiconductor substrate 101. The semiconductor substrate 101 may be a silicon (Si) substrate, a germanium (Ge) substrate, a silicon germanium (SiGe) substrate, or a semiconductor on insulator (all) substrate to name a few. The substrate 101 may include layers of one or more of the aforementioned materials.

A number of bottom electrode regions 102, 104 are formed on the substrate 101. The bottom electrode regions may as shown be formed as fin-shaped regions on the semiconductor substrate 101.

The semiconductor structure includes a plurality of vertical channel structures, commonly referenced 110, extending from the bottom electrode regions. The vertical channel structures 110 each extend in parallel to the vertical direction or normal direction of the substrate 101, indicated by "V" in FIG. 1a. The horizontal direction defined by the substrate 101 is indicated by "H".

In the illustrated semiconductor structure 100, for illustrative purposes, first through third vertical channel structures extend from each bottom electrode region 102, 104. This however merely represents an illustrative example and the number of vertical channel structures may be dependent on the type of circuitry that is to be formed. Hence, fewer or more vertical channel structures may extend from each bottom electrode region 102, 104. For instance, only a single or only two vertical channel structures may extend from each bottom electrode region.

Forming the semiconductor structure shown in FIG. 1a may include growing a semiconductor layer (not shown in FIG. 1a) on top of the substrate 101. The semiconductor layer may be grown, e.g., using an epitaxial growth process. The semiconductor layer may for instance be an un-doped, an extrinsically doped or an intrinsically doped (e.g., by an n- or p-type dopant) semiconductor layer. The semiconductor layer may for instance be formed by Si or SiGe. Vertical semiconductor structures 110 may be formed by etching the semiconductor layer using one or more vertical and anisotropic etch steps. The etching of the semiconductor layer may be preceded with deposition and patterning of a lithographic stack to form mask portions allowing etching of the vertical channel structures. A suitable combination of lithography and etch processes may be employed to form the illustrated vertical semiconductor structures, whose details are omitted herein.

The etching may be stopped when a top surface of the semiconductor substrate 101 is reached. Alternatively, the etching may be extended also into the semiconductor substrate 101. Vertical channel structures including a vertical portion formed by material of a thickness portion of the semiconductor substrate 101 and a vertical portion formed by a thickness portion of the material of the semiconductor layer may thereby be formed.

Bottom electrode regions including the regions 102 and 104 may subsequently be formed by a further lithography and etching process. A lithographic stack may be deposited and patterned to form mask portions defining the dimensions and positions of the bottom electrode regions. The semiconductor substrate 101 may thereafter be etched in regions exposed by the mask portions to form the bottom electrode regions as shown in FIG. 1a.

Prior to the etching, ion implantation may be performed to form n-type and p-type regions in the semiconductor substrate 101 in accordance with the type of device that is to be formed.

For the semiconductor structure illustrated in FIG. 1a, p- and n-type ion implantation may be performed in respective regions of the semiconductor substrate 101 such that, once the bottom electrode regions are formed, each bottom electrode region is provided with a first and a third sub-region that are doped with a p-type dopant, and a second sub-region intermediate the first and third sub-regions that is doped with an n-type dopant. Alternatively, each bottom electrode region may be provided with a first and a third sub-region that are doped with an n-type dopant, and a second sub-region intermediate the first and third sub-regions that is doped with a p-type dopant.

Silicidation may be performed at the junctions between the sub-regions to enable a low-resistance connection of the source/drains of the vertical channel structures formed on each bottom electrode region.

In the above, an example process flow for forming the vertical channel structures shown in FIG. 1a has been given. However, it will be appreciated that other suitable techniques are possible. For instance, the vertical channel structures 110 may be formed by epitaxially growing vertical semiconductor structures within vertical apertures formed in a sacrificial dielectric layer deposited on the semiconductor substrate 101. After completing the growth process, the sacrificial dielectric layer may be removed.

Figure 1B:
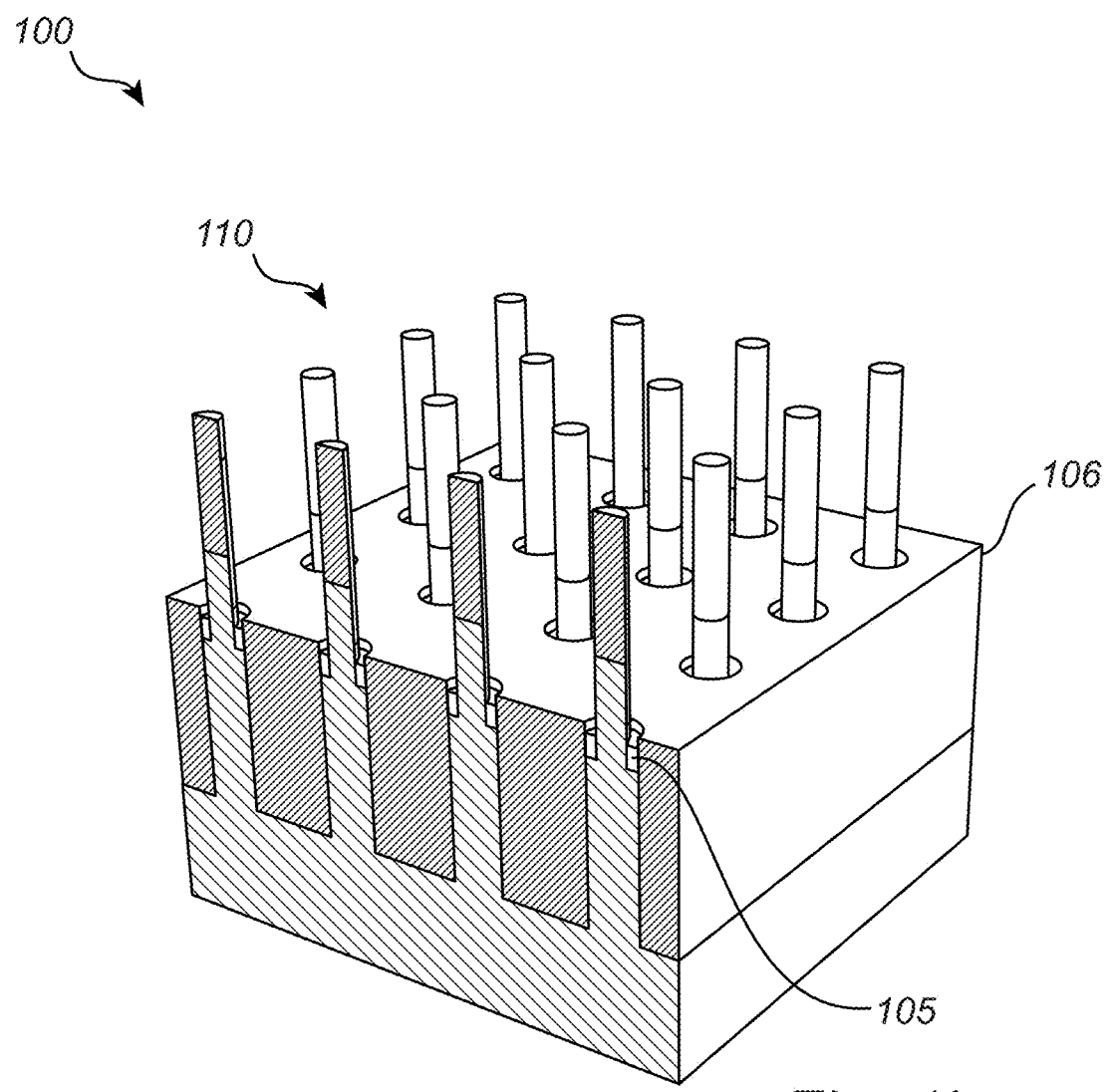

Referring to FIG. 1b, subsequent to forming the vertical channel structures 110 and the bottom electrode regions 102, 104, a dielectric layer 106, which may be referred to as a bottom dielectric layer 106, may be formed on the semiconductor substrate 101. The bottom dielectric layer 106 covers the bottom electrode regions 102, 104. The vertical channel structures 110 protrude from the bottom dielectric layer 106 to form respective protruding portions. It will be appreciated that the bottom dielectric layer 106 provides a spatial and electrical separation between the gates to be formed and the bottom electrode regions. Electrical isolation between the gates and the bottom electrode regions 102, 104 may hence be provided.

The bottom dielectric layer 106 may be formed of a suitable dielectric material. For example, the bottom dielectric layer 106 may include a silicon oxide material, for instance $SiO_2$, a organo-silicate-glass material or another low-K dielectric material. The bottom dielectric layer 106 may also include a stack of layers of different dielectric materials. The bottom dielectric layer 106 may be deposited by any conventional deposition process, such as chemical vapor deposition (CVD). The bottom dielectric layer 106 may be deposited to completely cover the vertical channel structures 110. The thickness of the bottom dielectric layer 106 may thereafter be reduced until protruding portions of the vertical channel structures 110 of a desired height have been obtained. The thickness reduction may be achieved by selectively etching the bottom dielectric layer 106 with respect to the vertical channel structures 110.

As indicated in FIGS. 1a-1b, a dielectric liner 105 may be formed on the upper surface of the bottom electrode regions 102, 104. The dielectric liner 105 may be a nitride-based liner, such as SiN. The dielectric liner 105 may be formed on the substrate 101 prior to the afore-mentioned etching of the substrate 101 for forming of the bottom electrode regions 102, 104. Portions of the dielectric liner 105 remaining on the protruding portions of the vertical channel structures 110 may be removed after the bottom dielectric layer 106 has been finally formed.

Figure 1C:
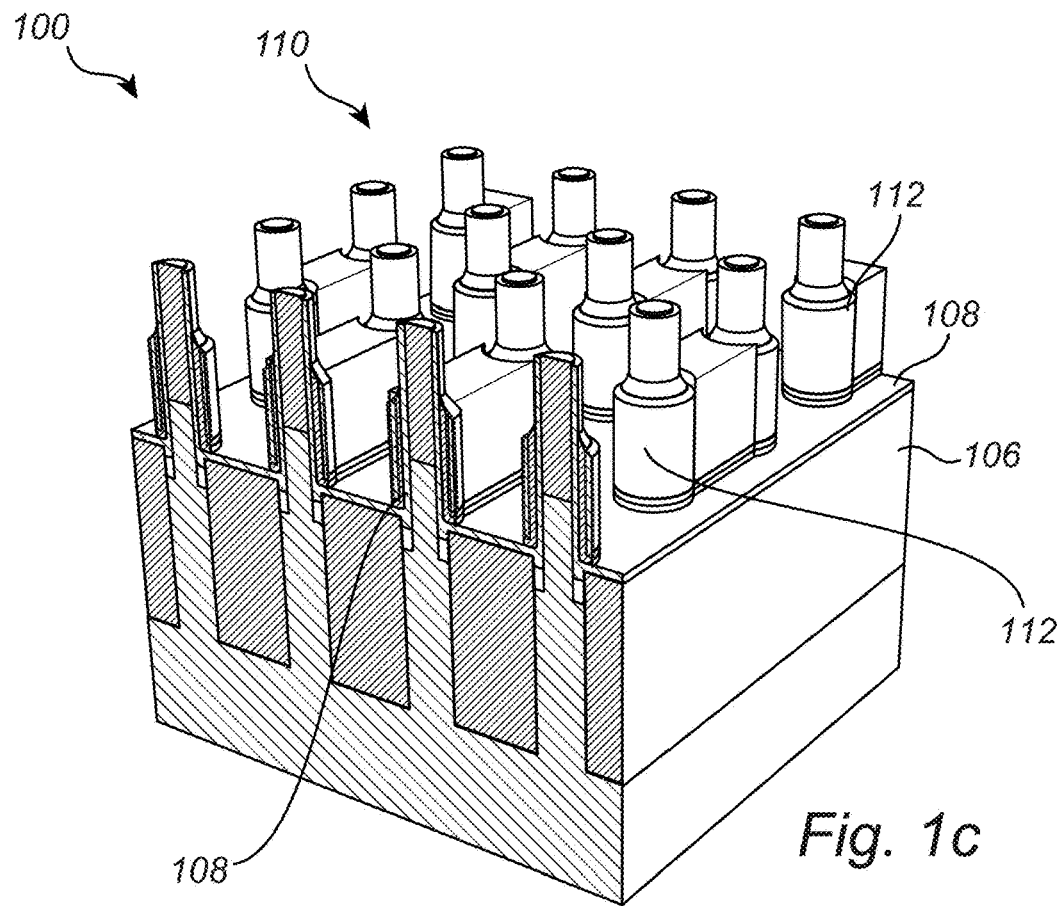

Referring to FIG. 1c, subsequent to forming the bottom dielectric layer 106, a conformal gate dielectric layer 108 may be formed. The gate dielectric layer 108 may cover at least the protruding portions of the vertical channel structures 110. The gate dielectric layer 108 may also cover the bottom dielectric layer 106. As shown, portions of the gate dielectric layer 108 formed on the vertical channel structures 110 surrounds, or encloses, the vertical channel structures 110 in a circumferential direction. Hence, the gate dielectric layer 110 covers the sidewall surfaces of the vertical channel structures 110.

In some embodiments, the gate dielectric layer 108 may be deposited as a conformal thin film. The gate dielectric layer 108 may be formed by a dielectric material such as a high-K dielectric material. The gate dielectric layer 108 may for instance be formed by $HfO_2$, $ZrO_2$, $Al_2O_3$, or other rare-earth oxides or metal oxide silicates such as $HfSiO_x$, $YSiO_x$, or $LaSiO_x$. The gate dielectric layer 108 may be a single layer dielectric material according to some embodiments, or a stack of different dielectric materials according to some other embodiments. To form the conformal gate dielectric layer 108, a suitable deposition process may be employed, for instance atomic layer deposition (ALD).

Still referring to FIG. 1c, each vertical channel structure 110 is provided with a wrap-around gate 112. Forming the wrap-around gates may include forming a gate level conductor with a thickness such that the vertical channel structures 110 are completely embedded and covered by the gate level conductor. The gate level conductor may thereafter be removed from upper portions of the vertical channel structures 110 by reducing a thickness of the gate level conductor. Due to the vertical orientation of the channel structures 110, the gate length for the vertical channel structures is defined by the thickness of the gate level conductor, i.e. the dimension along the vertical direction V.

As shown in FIG. 1c, gates 112 may be shared by pairs of adjacent vertical channel structures 110. This is however merely an example and some or all of the vertical channel structures 110 may instead be provided with individual gates. Typically, the layout of the gates may be varied depending on the type of device and circuitry that is to be formed.

Depending on the materials and composition of the gate level conductor, the thickness reduction may be achieved using one or more different process steps including polishing, for instance by chemical mechanical polishing (CMP) and one or more etch processes. If the layers of the gate level conductor may be etched at a substantially same rate by a common etching chemistry a single etch step may suffice. Alternatively, an etching process including a number of etching steps may be used. The etching process(es) are preferably selective with respect to the gate dielectric layer 108 wherein the vertical channel structures 110 may be protected from the etching chemistries used during the thickness reduction.

The gate level conductor may include at least one conductive layer. The gate level conductor may include a first metal layer formed as a conformal layer. The first metal layer may cover the gate dielectric layer 108 on the protruding portions of the vertical channel structures 110 and on the bottom dielectric layer 106. The first metal layer may be formed by one metal material or by a combination or a stack of sub-layers of one or more metal materials, whose material may be selected in accordance with the type of the transistor to be formed (e.g., p or n type) and the desired threshold voltage of the transistor. The first metal layer may for instance be formed by a p-type work function metal such as TiN, TaN, TiTaN, or by a combination or stack thereof. The first metal layer may also be formed by an n-type work function metal such as Al, TiAl, TiC, or TiAlC or by a combination or a stack thereof. The first metal layer may be deposited by a suitable deposition process, for instance by ALD, CVD or tilted physical vapor deposition (PVD).

The gate level conductor may further include a second metal layer formed on the first metal layer. The second metal layer may be selected to provide a suitably low electrical resistivity. The second metal layer may be formed to completely embed and cover the protruding portions of the vertical channel structures 110. The second metal layer may be formed by one metal material or by a combination or a by a stack of sub-layers of one or more metal materials. The second metal layer may for instance be formed by W, Al, Co, Ni or Ru, or an alloy of two or more of said materials, or a stack of two or more of said materials. The second metal layer may be deposited by a suitable deposition process, for instance by CVD or by electro-plating.

After reducing the thickness of the gate level conductor, the gate level conductor may be patterned using suitable lithography and etch processes such that discrete gates are formed about the vertical channel structures 110. An etch mask may be formed above the gate level conductor, the etch mask including discrete mask portions defining the horizontal position and horizontal extension of the gates that are to be formed. An etch mask layer may be formed on the gate level conductor. A patterning layer including, e.g., a photo-resist layer may be formed on the etch mask layer. The photo-resist layer may be patterned in a lithography process. The pattern may be transferred into the etch mask layer by etching, thereby forming the final etch mask including the mask portions. The gate level conductor may subsequently be etched in regions exposed by the etch mask such that the respective gates are formed. The etching of the gate level conductor may be stopped when the gate level dielectric 108 is exposed or when the bottom dielectric layer 106 is exposed. Suitable etching processes for the various above-mentioned material examples of the gate level conductor may be used. By way of example, suitable etching chemistries include Cl-based etching chemistry and/or chlorine oxide-based etching chemistry and/or F-based etching chemistry.

Figure 1D:
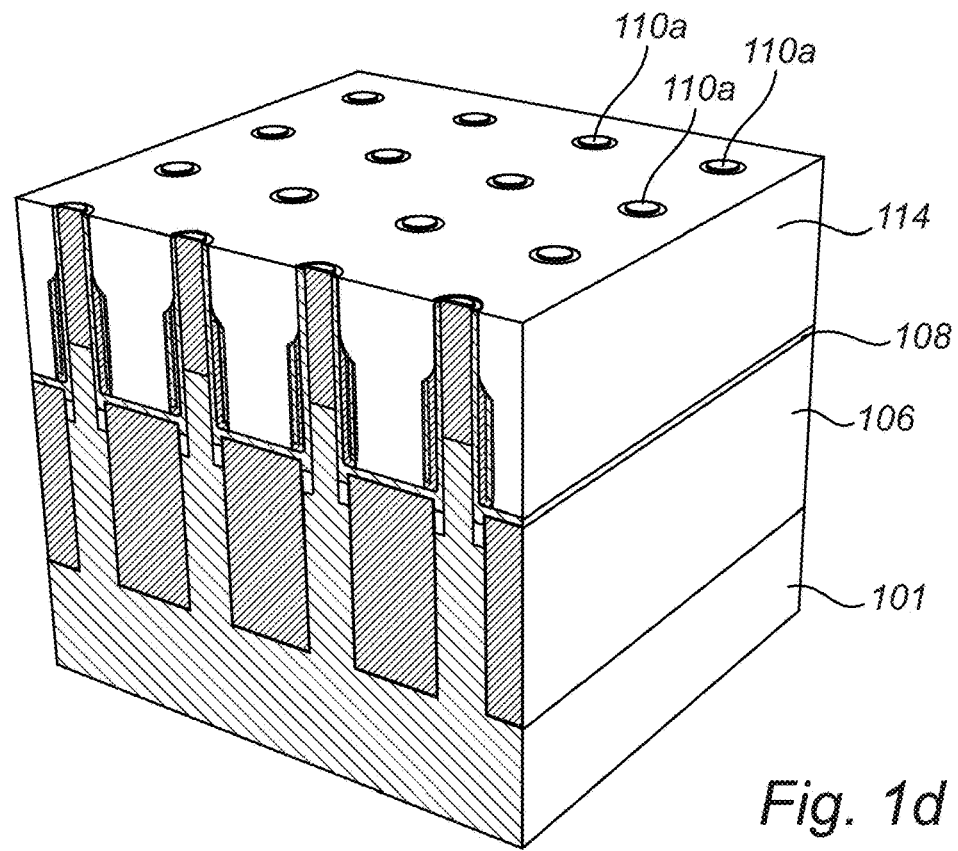

In FIG. 1d, a first dielectric layer 114 embedding the gates 112 has been formed. The first dielectric layer 114 is formed such that top portions 110a of the vertical channel structures 110 protrude above the upper surface of the first dielectric layer 114. The upper surface of the first dielectric layer 114 extends above the gates 112. It will be appreciated that the first dielectric layer 114 provides a spatial and electrical separation or offset between the gates and the top electrodes, which are to be formed. Electrical isolation between the gates 112 and the top electrodes may hence be provided.

The first dielectric layer 114 may be formed of a dielectric material that is the same as or different from the bottom dielectric layer 106 and be formed using the same or different type of deposition process. The first dielectric layer 108 may be deposited to completely cover the vertical channel structures 110. The thickness of the first dielectric layer 114 may thereafter be reduced until the vertical channel structures 110 protrude above the first dielectric layer 114 with a desired height, while still covering the gates 112. Alternatively, the upper surface of the first dielectric layer 114 may substantially be coplanar with the top surfaces of the top portions 110a of the vertical channel structures 110. The thickness reduction may be achieved by, e.g., selectively etching the first dielectric layer 114 with respect to the vertical channel structures 110. During the thickness reduction portions of the gate dielectric layer 108 may also be stripped from the top portions of the vertical channel structures 110.

Figure 1E:
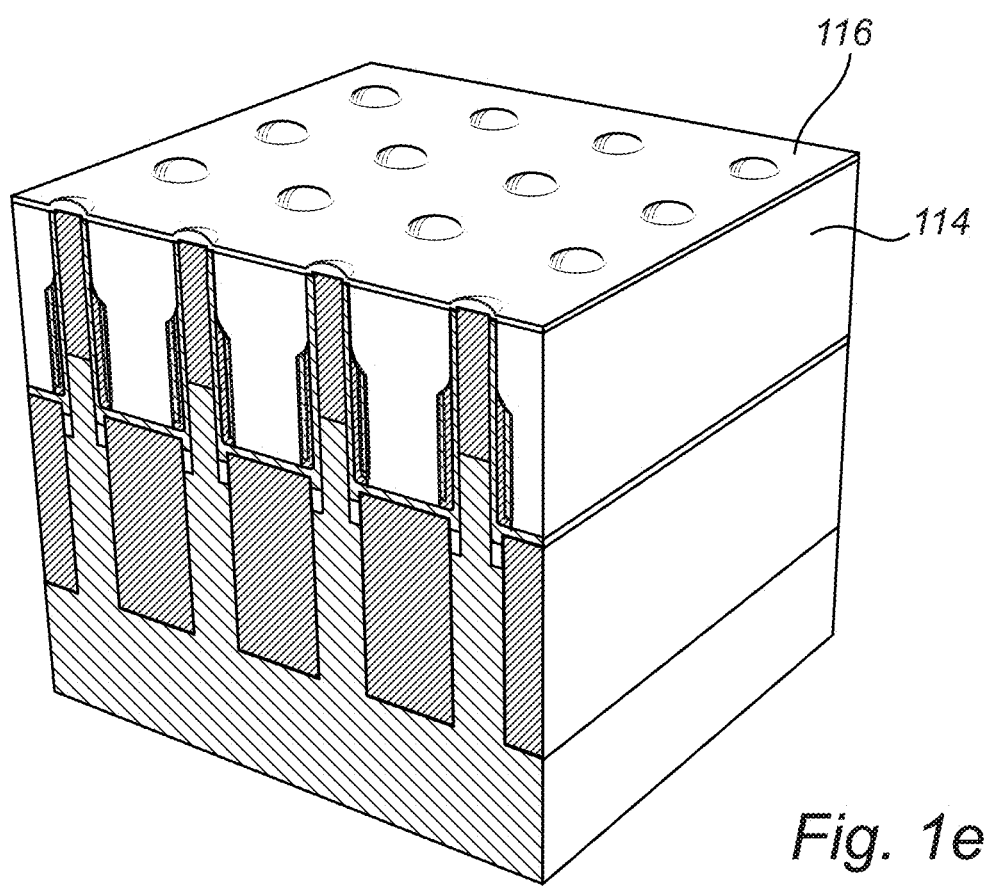
Figure 1F:
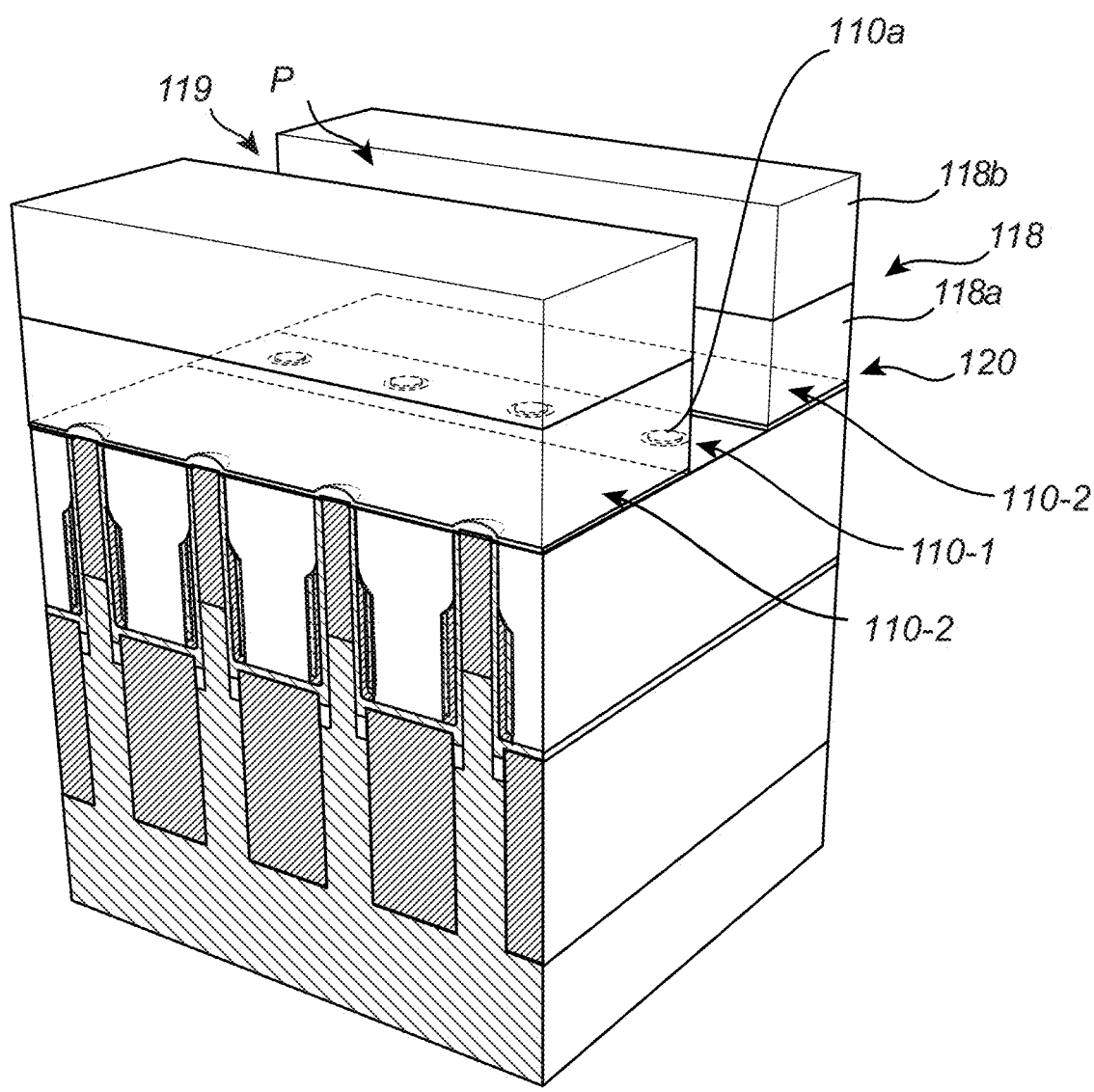

FIGS. 1e-1f shows formation of a first mask 120 exposing the top portions 110a of a first subset 110-1 of vertical channel structures and covering the top portions of a second subset 110-2 of vertical channel structures. With reference to FIG. 1e, a first mask layer 116 is formed to cover the top portions 110a of the vertical channel structures 110. The first mask layer 116 covers the upper surface of the first dielectric layer 114. The first mask layer 116 may be formed as a conformal layer. In some embodiments The first mask layer 116 may be formed by a non-resist based material. The first mask layer 116 may be formed by a hard mask material, for instance a nitride-based material such as SiN or SiCN, or a silicon oxide. However, any other material which may withstand the process conditions during the subsequent growth of semiconductor material, to be described below, may also be used. The first mask layer 116 may be deposited by ALD.

With reference to FIG. 1f, a first mask patterning layer 118 has been formed on the first mask layer 116. The first mask patterning 118 layer has been provided with an opening 119 in a region above the top portions 110a of the first subset of vertical channel structures 110-1. The first mask patterning layer 118 may as shown include a stack of layers such as a spin-on-carbon layer 118a or other carbon-based layer and a photo resist layer 118b. Although not shown, the stack may include further layers such as a Si-including layer between layers 118a and 118b. The opening 119 may be patterned in the photo resist layer using lithography and transferred into the lower layers 118a of the first mask patterning layer 118 by etching.

As shown in FIG. 1f, the first mask layer 116 has subsequently been opened in a region exposed in the opening 119 of the first mask patterning layer 118. The opened first mask layer 116 forms the final first mask 120.

Figure 1G:
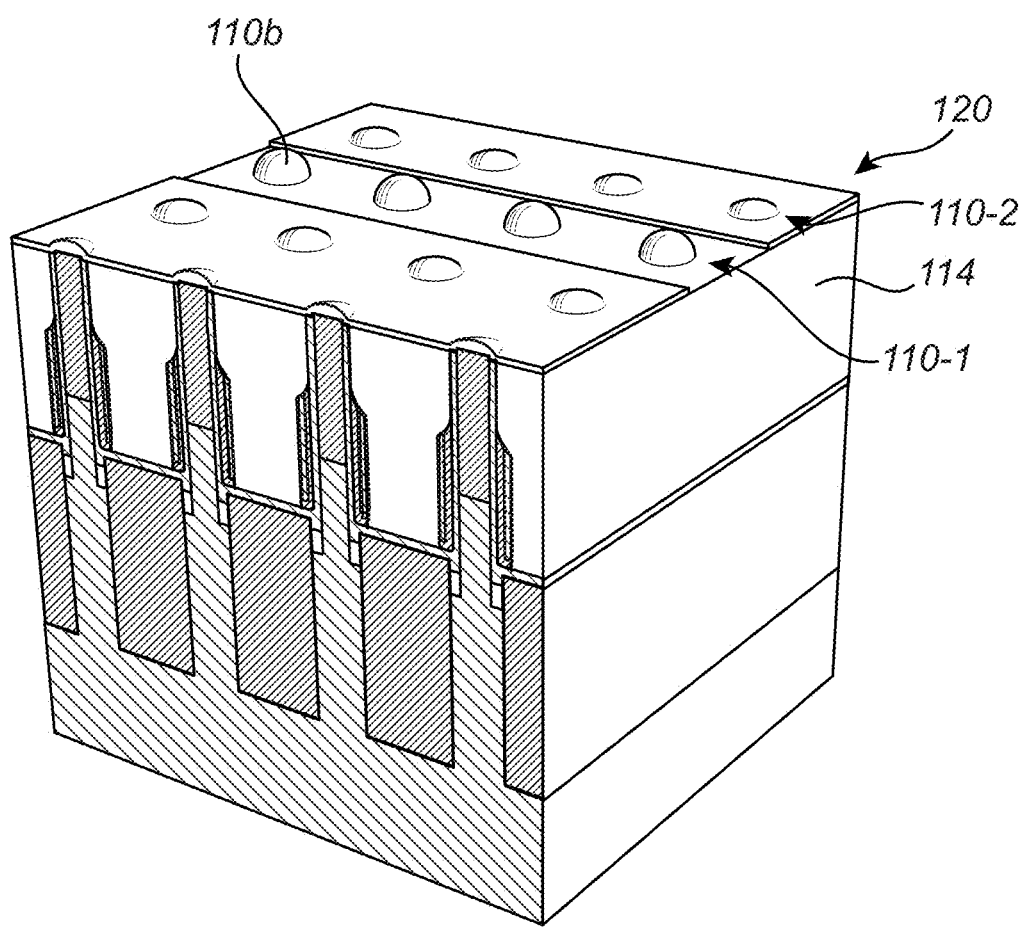

In FIG. 1g, the first mask patterning layer 118 has been stripped from the first mask 120. A first doped semiconductor material has been grown selectively on the top portions 110a of the first subset of vertical channel structures 110-1. The first subset 110-1 is selected or defined by the first mask 120. Enlarged top portions 110b are thereby formed on the vertical channel structures 110 of the first subset 110-1. The growth of the first semiconductor material may be continued until enlarged top portion 110b of desired dimensions have been obtained.

The first semiconductor material may include Si or SiGe. The first semiconductor material may be doped with a first type of dopant, i.e. an n-type or p-type dopant, in accordance with the desired type of charge carriers for the vertical channel devices of the first subset. The semiconductor material may be doped by introducing appropriate impurities in the reaction chamber during the growth process.

The semiconductor material may be grown by selective epitaxy, for instance selective Si epitaxy or selective SiGe epitaxy. In such a process, semiconductor material may have a very low tendency to nucleate on the exposed upper dielectric surface of the first dielectric layer 114 on the first mask 120 and prefer to nucleate on the semiconductor material of the exposed top portions 110a of the vertical channel structures 110.

Prior to forming the enlarged top portions 110b, and prior to removing the first mask patterning layer 118 from the first mask 120, the top portions 110a of the first subset of vertical channel structures 110-1 may be subjected to ion implantation, schematically illustrated by "P" in FIG. 1f. The first mask 120 and the first mask patterning layer 118 may act as an implantation mask during the ion implantation and accordingly counteract implantation in the top portions 110a of the second subset of vertical channel structures 110-2. Subsequent to the ion implantation, the first mask patterning layer 118 may be removed from the first mask 120 wherein the first semiconductor material may be grown on the top portions 110a of the first subset of vertical channel structures 110-1, as set out above.

Figure 1H:
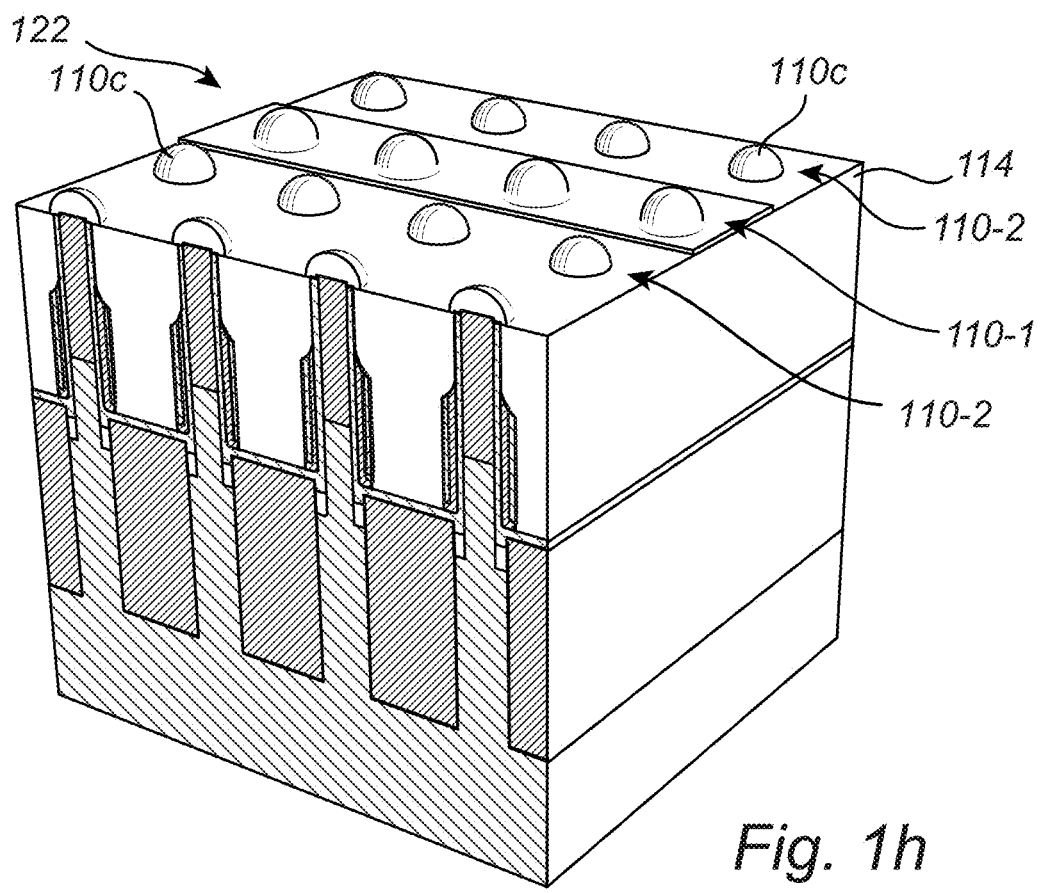
Figure 1I:
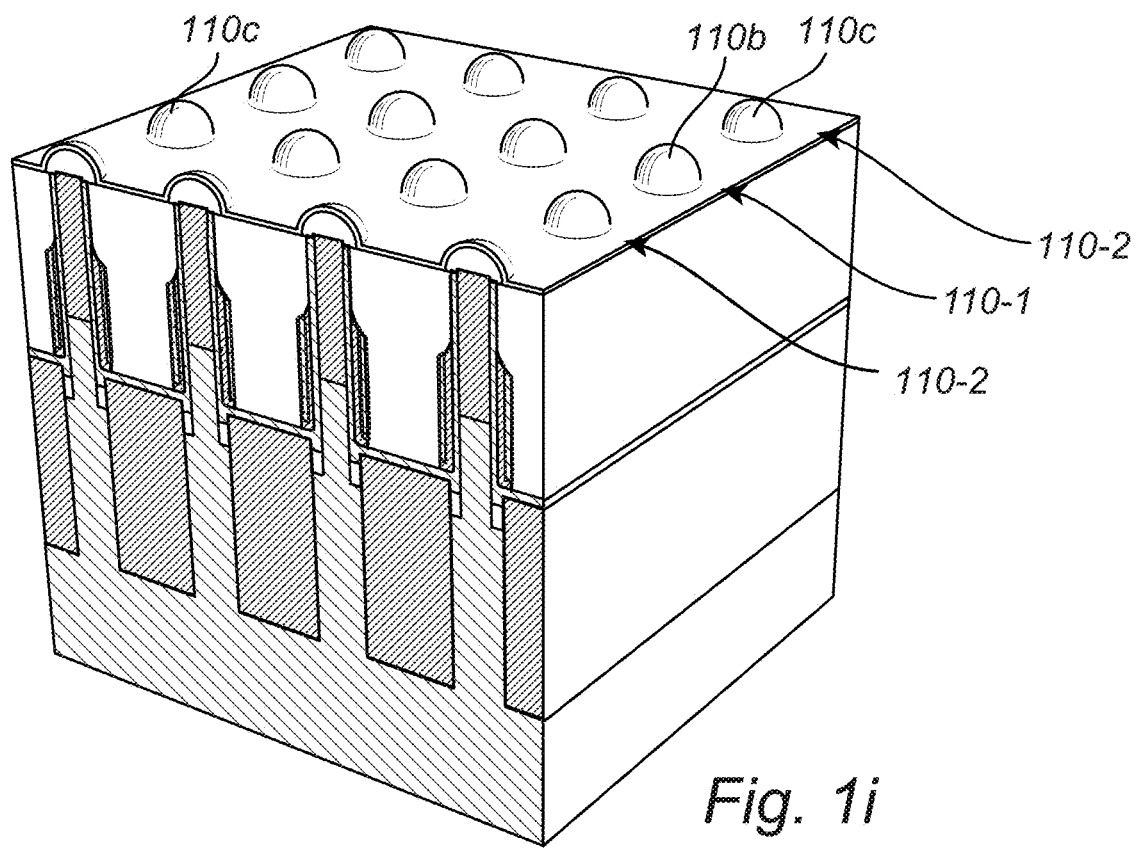

The process described in connection with FIGS. 1e-1g may subsequently be repeated to form enlarged top portions 110c of a second doped semiconductor material on the second subset of vertical channel structures 110-2. This is shown in FIGS. 1h-1i. A second mask 122 exposing the top portions of the second subset of vertical channel structures 110-2 and covering the enlarged top portions of the first subset of vertical channel structures 110-1 may be formed. The second subset 110-2 is selected or defined by the second mask 122. The second mask 122 may be formed in an analogous manner as the first mask 120 by forming a second mask layer corresponding to the first mask layer 116 and a second mask patterning layer corresponding to the first mask patterning layer 118. The second mask patterning layer may however be provided with an opening in a region above the top portions of the second subset of vertical channel structures 110-2. The second doped semiconductor material may subsequently be grown on the top portions 110a of the second subset of vertical channel structures 110-2 (possibly after performing ion implantation of the top portions of the second subset 110-2 as set out above), thereby forming the enlarged top portions 110c.

Figure 1J:
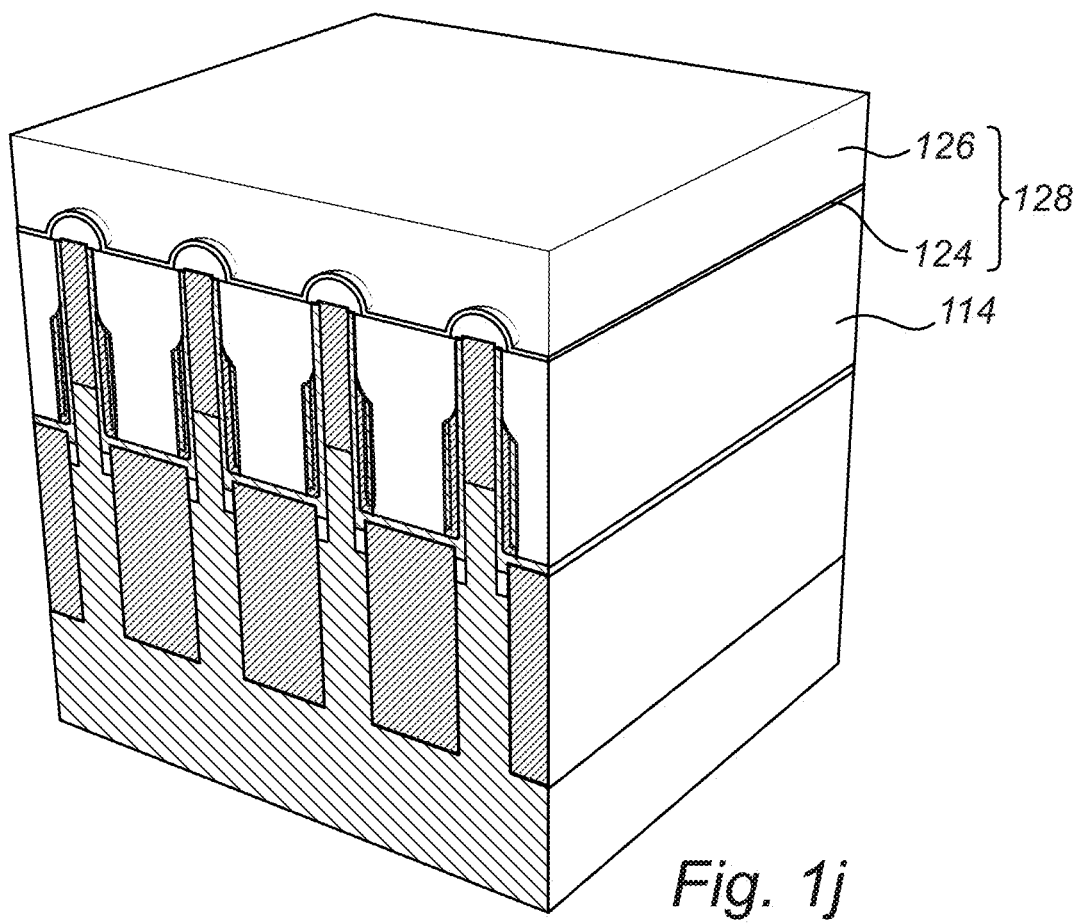
Figure 1K:
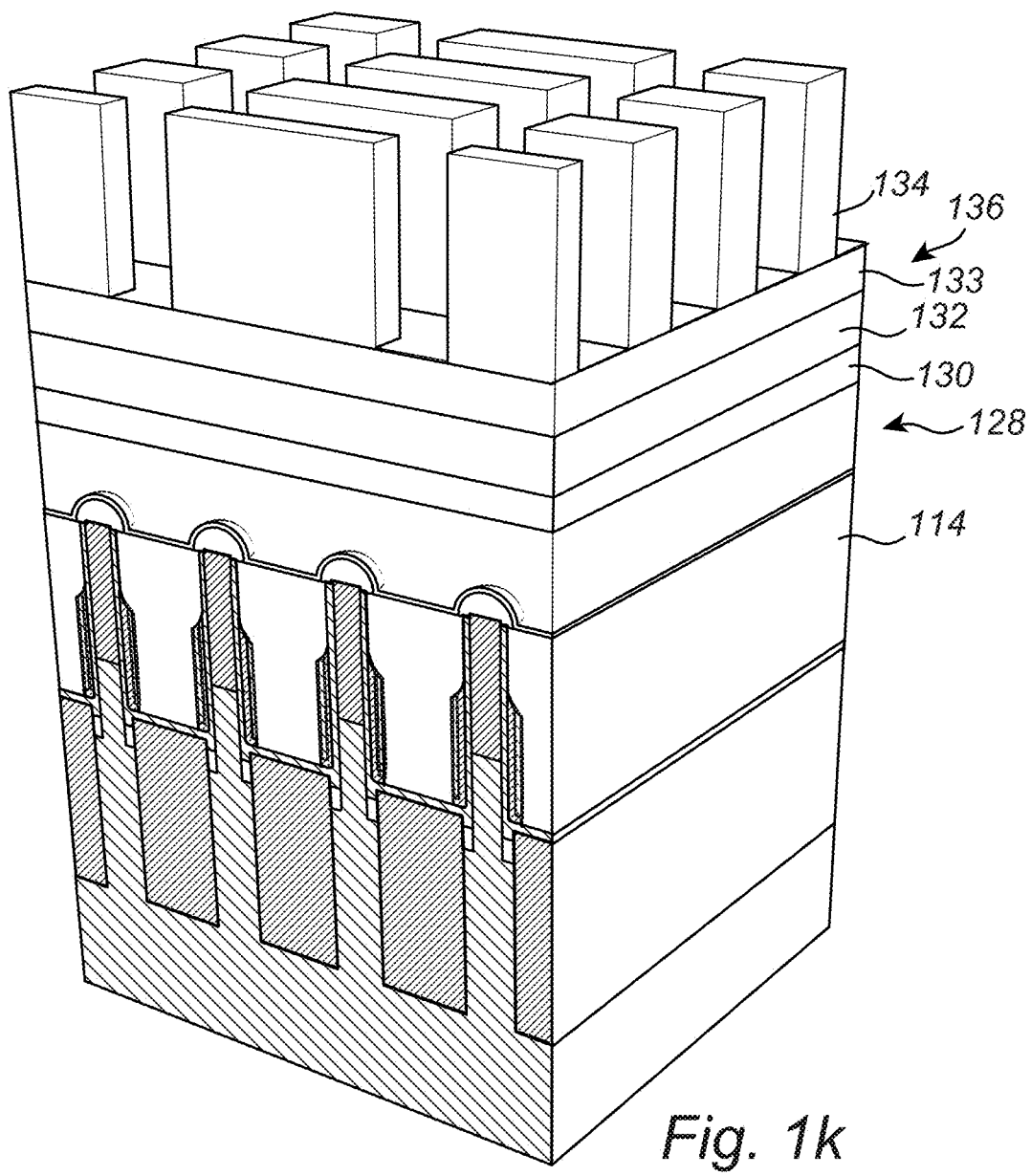
Figure 1I:
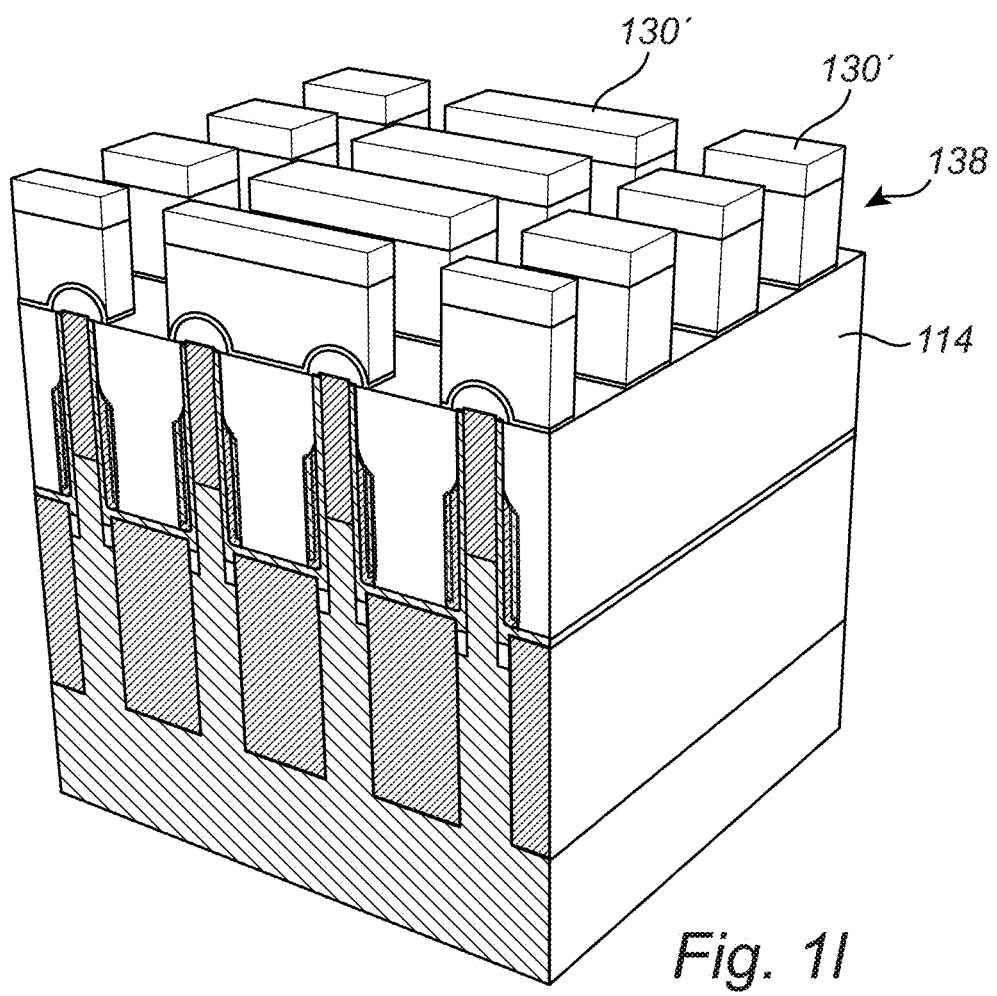

FIGS. 1j-1l shows formation of top electrodes on the enlarged top portions 110b of the vertical channel structures 110. However, embodiments are not so limited and in other embodiments, the forming of the enlarged top portions 110b, 110c as set out above may be omitted. In that case, the top electrodes may be formed directly on the non-enlarged protruding portions 110a of the vertical channel structure 110a.

With reference to FIG. 1j, a first conductive top electrode layer 124 (or shorter first top electrode layer 124) of a composite top electrode layer 128 has been formed on the first dielectric layer 114. The first top electrode layer 124 covers, and is formed in direct contact with, the enlarged top portions 110*b*, 110*c*. The first top electrode layer 124 may be formed as a conformal layer. The first top electrode layer 124 may for instance be formed by Ti, TiN or WN. The first top electrode layer 124 may be formed by ALD, CVD or PVD.

With reference to FIG. 1*j*, a second conductive top electrode layer 126 (or shorter second top electrode layer 126) of the top electrode layer 128 has been formed on the first top electrode layer 124 to cover the same. The second top electrode layer 126 may be formed as either a conformal layer or non-conformal layer. The second top electrode layer 126 may for instance be formed by W, Co, Ni, Ru or an alloy of two or more of said materials. The second top electrode layer 126 may be formed by CVD or by electro-plating.

Although not shown in FIG. 1*j*, further conductive layers may be included in the top electrode layer 128 to obtain a composite top electrode layer 128 with desired thickness and electrical properties.

With reference to FIG. 1*k* an upper etch barrier layer 130 has been formed on the top electrode layer 128. The upper etch barrier layer 130 covers the top electrode layer 128. The upper etch barrier layer 130 may for instance be formed of a nitride-based material such as SiN or SiCN, however non-nitride based materials may also be used such as SiCO. For the purpose of a subsequent etching of holes in the first dielectric layer 114, the material of the upper etch barrier layer 130 may be chosen to allow etching of the first dielectric layer 114 selective to the upper etch barrier layer 130.

A top electrode mask layer 136 has been formed on the upper etch barrier layer 130. The top electrode mask layer 136 covers the upper etch barrier layer 130. The top electrode mask layer 136 may as shown include a stack of layers such as a spin-on-carbon layer 132 or other carbon-based layer and a photo resist layer 134. As shown, the stack may include further layers such as a Si-including layer 133 between layers 132 and 134. A top electrode pattern has been formed in the photo resist layer 134 using lithography. The top electrode pattern may be transferred into the lower layers of the top electrode mask layer 136 by etching to form a set of discrete mask portions. Each mask portion of the top electrode pattern may be formed to overlap at least one enlarged top portion 110*b*, 110*c* as viewed along the vertical direction V.

With reference FIG. 1*l*, the upper etch barrier layer 130 and the top electrode layer 128 have been etched while using the patterned top electrode mask layer as an etch mask. The etch may be continued until the upper surface of the first dielectric layer 114 is exposed. Thereby a set of discrete top electrodes 138 have been formed on the enlarged top portions 110*b* of the vertical channel structures 110. Each top electrode 138 is provided with a respective remaining upper etch barrier (portion) 130' of the upper etch barrier layer 130. An etching process including a number of etching steps may be used to allow etching of first the upper etch barrier 130', and subsequently the top electrode layer 128. Suitable etching chemistries may include Cl-based etching chemistry and/or chlorine oxide-based etching chemistry and/or F-based etching chemistry.

In FIG. 1*l*, top electrodes 138 are shared by some pairs of adjacent vertical channel structures 110. This is however merely an example and all of the vertical channel structures 110 may instead be provided with individual the top electrodes 138. Typically, the layout of the gates may be varied depending on the type of device and circuitry that is to be formed.

As may be understood from the above, a semiconductor structure or device 100 may be formed including a plurality of vertical channel devices wherein each vertical channel device includes a vertical channel structure 110. More specifically, the vertical channel devices may be vertical channel transistor devices. A channel region of each vertical channel device may be formed in a portion of a respective vertical channel structure 110 enclosed by a respective gate 112. A first source/drain region may be formed in a portion of the vertical channel structure 110 arranged below the channel region portion. The first source/drain region may also extend into the bottom electrode region (e.g., region 102 or 104). A second source/drain region may be formed in a top portion 110*a*, or enlarged top portion 110*b*, 110*c* of the vertical channel structure 110.

Figure 1M:
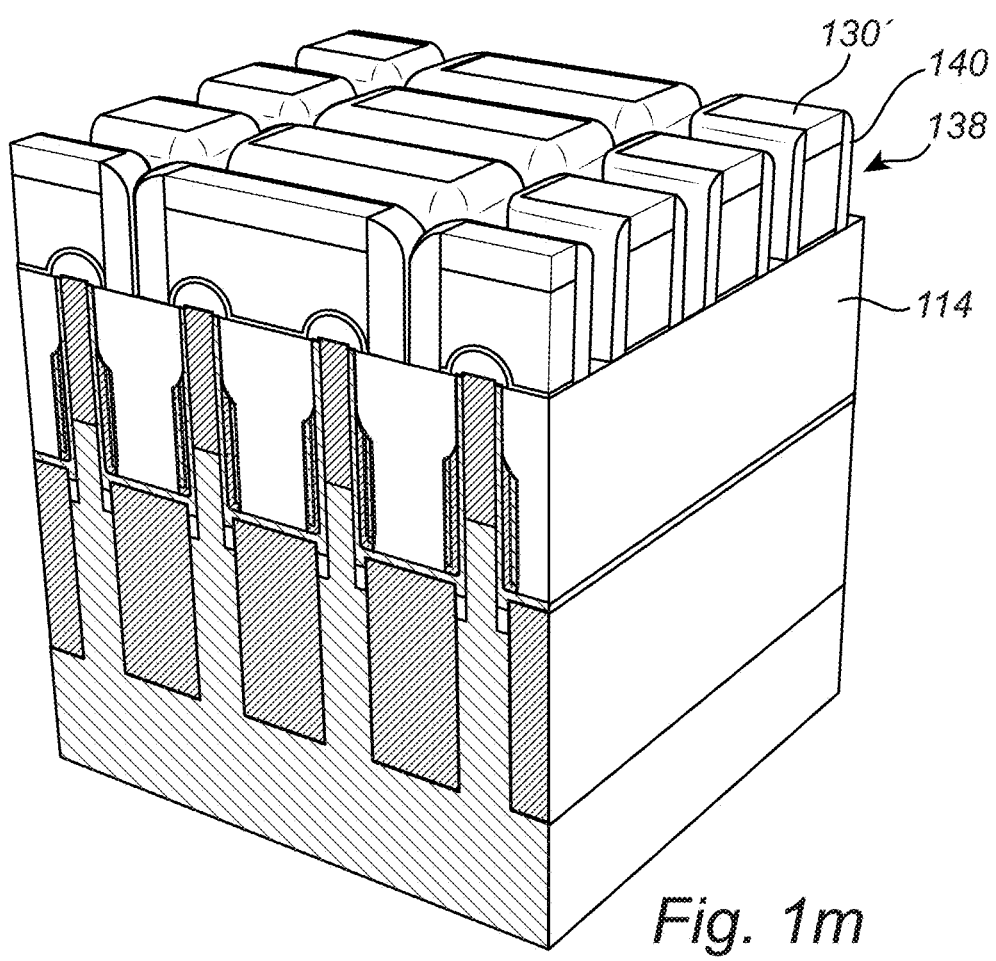

With reference FIG. 1*m*, a sidewall etch barrier 140 has been formed on sidewalls of the top electrodes 138. The sidewall surfaces and upper surfaces of the top electrodes are hence completely covered by the upper etch barrier 130' and the sidewall etch barrier 140.

The sidewall etch barrier 140 may be formed by forming a conformal etch barrier layer (not shown) covering the first dielectric layer 114 and the top electrodes 138. In the illustrated embodiment, the etch barrier 140 forms a spacer structure on sidewalls of the top electrodes 138. By performing an anisotropic and vertical etch of the etch barrier layer, etch barrier layer portions may be removed from the first dielectric layer 114 and upper surfaces of the upper etch barriers 130' while preserving etch barrier layer portions on the sidewalls of the top electrodes 138, thereby forming the spacer structure. The side wall etch barrier layer may be formed by any one of the materials discussed in connection with the upper etch barrier layer 130. The side wall etch barrier layer may for instance be formed by a same material as the upper etch barrier layer 130. The side wall etch barrier layer may be deposited by ALD. The sidewall etch barrier layer is formed with a thickness such that, following the vertical etching thereof, the first dielectric layer 114 is exposed in gaps formed between sidewall etch barrier's on adjacent top electrodes 138.

Figure 1N:
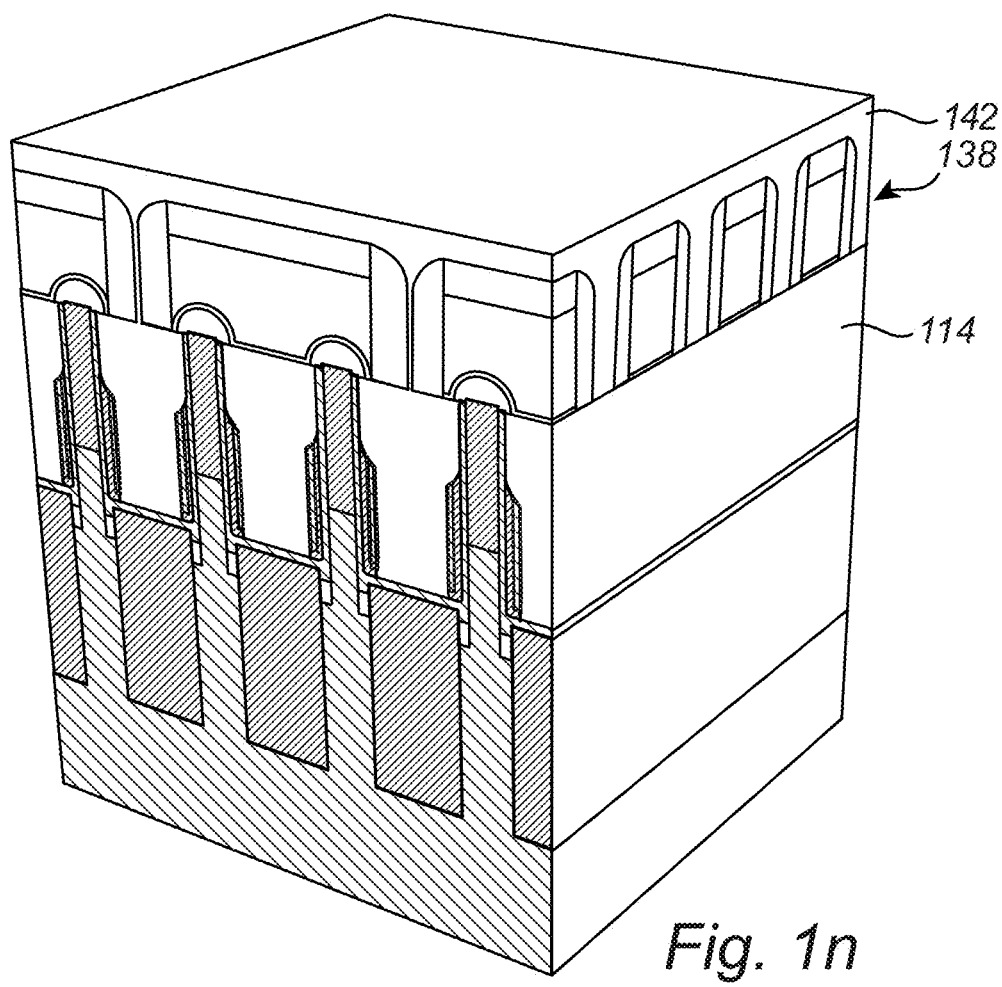

With reference to FIG. 1*n*, a second dielectric layer 142 has been formed to cover the first dielectric layer 114 and the top electrodes 138. The second dielectric layer 142 may be formed as a planarization layer. The second dielectric layer 142 may be formed in a same manner as discussed in connection with the first dielectric layer 114. The second dielectric layer 142 may be formed by any of the materials discussed in connection with the first dielectric layer 114.

Figure 1O:
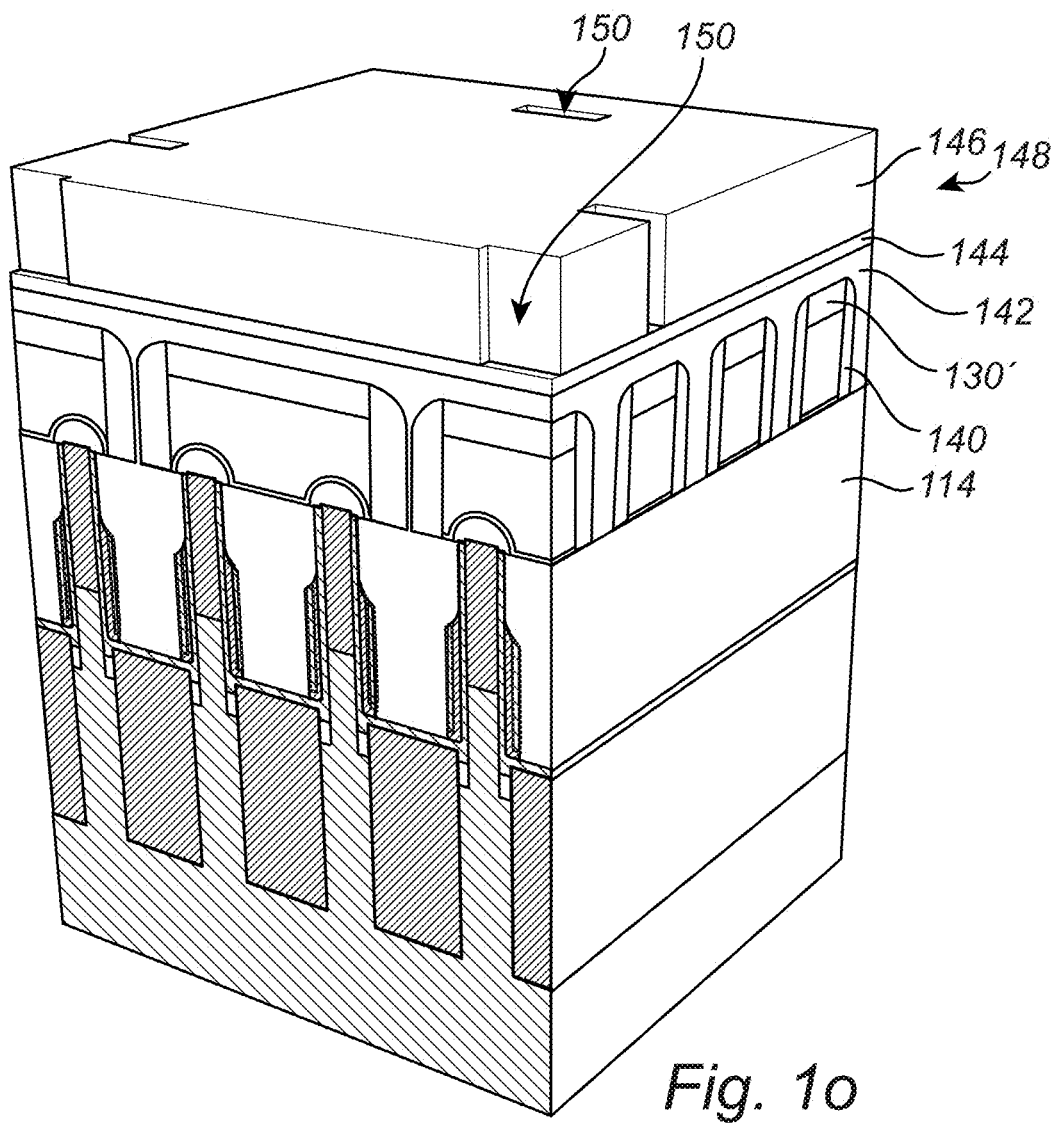
Figure 1P:
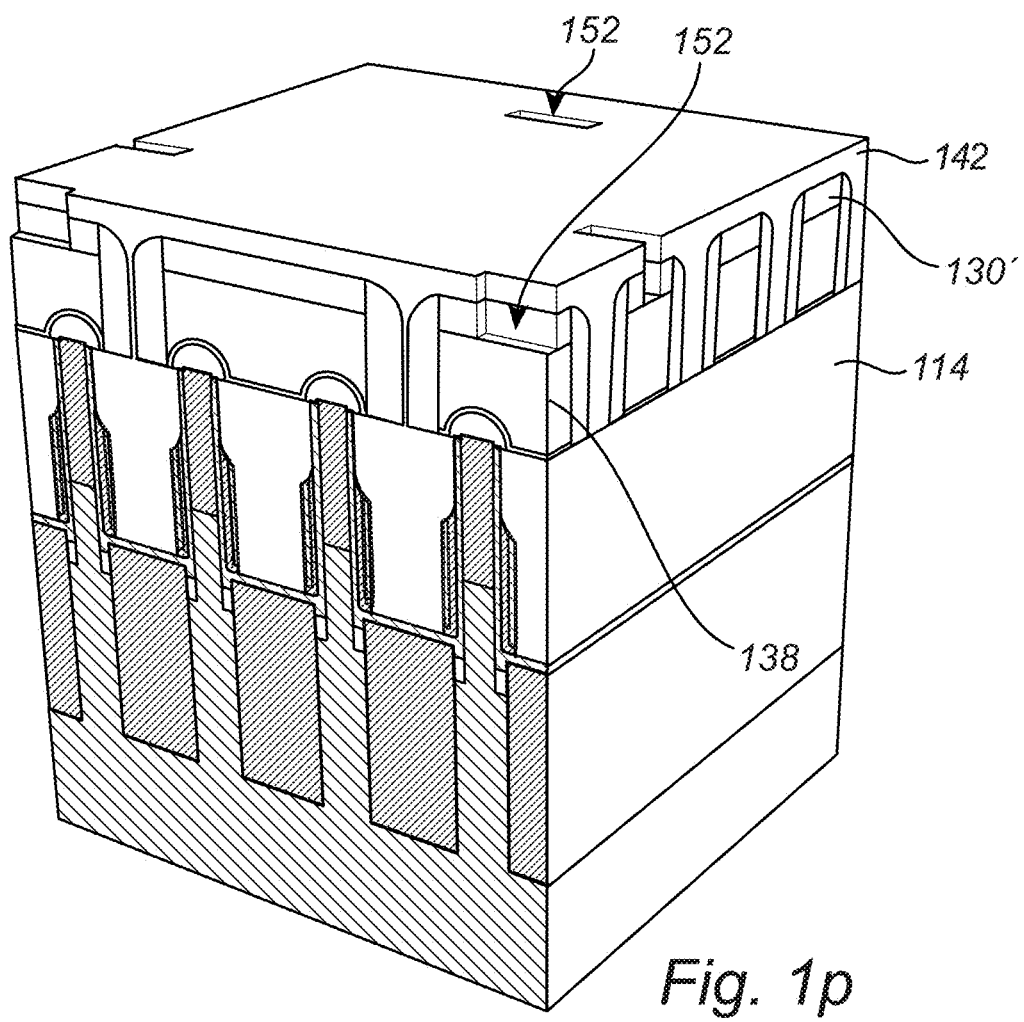

FIGS. 1*o*-1*p* illustrates formation of a set of top contact holes 152 in the second dielectric layer 142.

With reference to FIG. 1*o*, a top contact mask layer 148 has been formed on the second dielectric layer 142. Openings 150 have been formed in the top contact mask layer 148. The openings 150 define the locations of the top contact holes 152, which are to be formed.

The top contact mask layer 148 may as shown include a stack of layers such as a spin-on-carbon layer 144 or other carbon-based layer and a photo resist layer 146. Although not shown, the stack may include further layers such as a Si-including layer between layers 144 and 146. A top contact hole pattern has been formed in the photo resist layer 146 using lithography. The gate hole pattern has been transferred into the lower layers of the top electrode mask layer 148 to form the openings 150.

With reference to FIG. 1*p*, the set of top contact holes 152 has been formed by etching the second dielectric layer 142, through the openings 150 in the top contact mask layer 148. Each hole 152 exposes an upper surface of a top electrode 138. The etching of the hole 152 may include a final etch step using a different etching chemistry than the etching through the second dielectric layer 142 for opening the upper etch barrier 130'. After the set of top contact holes 152 has been formed, the top contact mask layer 148 may be stripped, thereby arriving at the structure shown in FIG. 1*p*.

Figure 1Q:
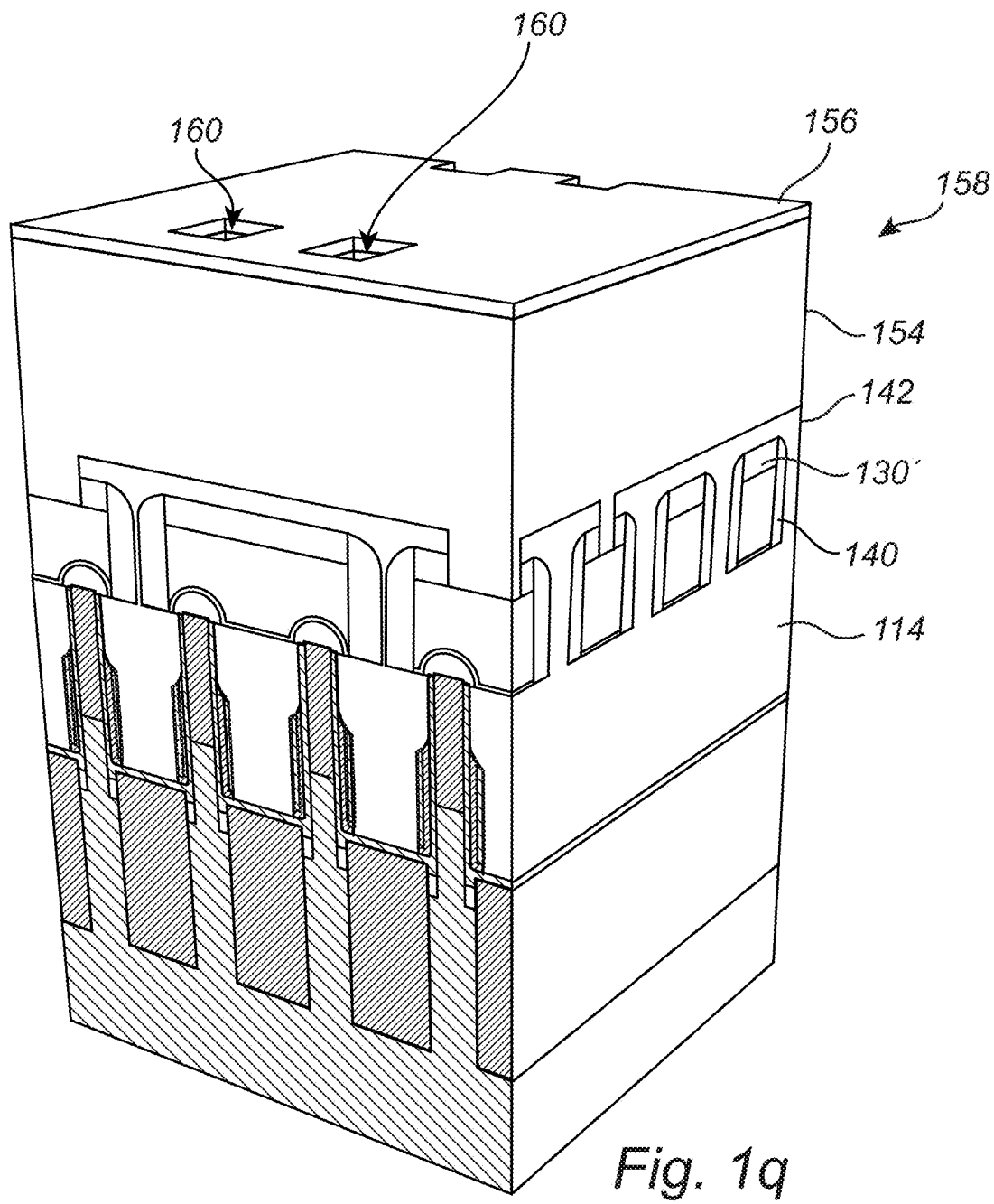
Figure 1R:
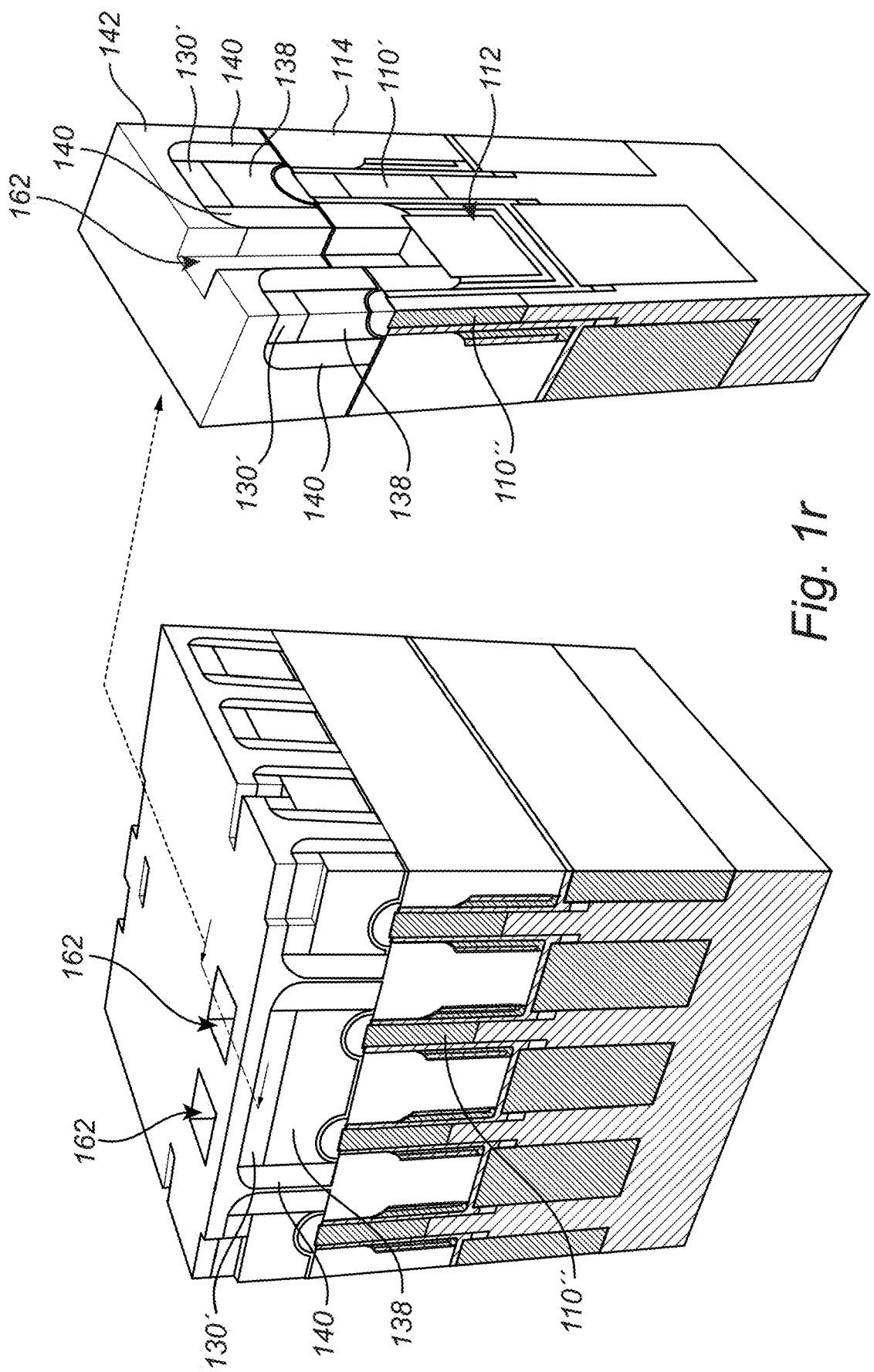

FIGS. 1*q*-1*r* illustrates formation of a set of gate contact holes 162 in the second dielectric layer 142.

With reference to FIG. 1*q*, a gate contact mask layer 158 has been formed on the second dielectric layer 142. Openings 160 have been formed in the gate contact mask layer 158. The openings 160 define the locations of the gate contact holes 162, which are to be formed.

As may be seen in the FIGS. 1*q*-1*r*, the top electrodes 138 may be formed with a horizontal dimension which is smaller than a horizontal dimension of the gates 112 such that the gates 112 may protrude outside the top electrodes, as viewed along the direction V. This enables each gate contact hole 162 to be formed to expose a horizontally oriented top surface of a gate 112.

The gate contact mask layer 158 may as shown include a stack of layers such as a spin-on-carbon layer 154 or other carbon-based layer and a photo resist layer 156. Although not shown, the stack may include further layers such as a Si-including layer between layers 154 and 156. A gate hole pattern has been formed in the photo resist layer 156 using lithography. The gate hole pattern has been transferred into the lower layers of the gate electrode mask layer 158 to form the openings 160.

With reference to FIG. 1*r*, the set of gate contact holes 162 has been formed by etching the first and second dielectric layers 114, 142, through the openings 160 in the gate contact mask layer 158. Each hole 162 exposes an upper surface of a gate 112. To clarify the extension of the hole 162 a further sub-section is shown in FIG. 1*r*, which illustrates the structure along the cut indicated in the main view of FIG. 1*r*. The cut extends through the two vertical channel structures 110' and 110". As shown, the hole 162 extends vertically down to the gate 112.

During the etching of the first and second dielectric layers 114, 142 the upper etch barrier 130' and the sidewall etch barrier 140 counteracts the etching from exposing upper or sidewall surfaces of the top electrodes 138. As may be seen in FIGS. 1*q*-1*r*, the openings 160 may be formed to present width dimension such that the etching through the openings 160 exposes the sidewall etch barrier layer 140 of top electrodes 138 adjacent to a gate contact hole 162. After the set of gate contact holes 162 has been formed, the gate contact mask layer 158 may be stripped.

In FIG. 1*r* the gate 112 is shared by the vertical channel structures 110' and 110". However, a hole 162 may be formed in a corresponding manner to expose a non-shared gate 112. Although in FIG. 1*r*, an upper surface of the gate 112 is exposed. It may also be possible to form a hole 162 such that also, or only a sidewall surface of a gate 112 is exposed. Also such a configuration allows an electrical contact between the gate 112 and a conductive material filling the hole 162.

With reference to FIG. 1*s*, the set of gate contact holes 162 and the set of top contact holes 152 have been filled with a conductive material. A conductive material layer 164 covering the second dielectric layer 142 and filling the set of holes 152, 162 has been formed. The conductive material layer 164 may be formed by one metal material or by a combination, an alloy or a stack of sub-layers of one or more metal materials. The conductive material layer 164 may for instance be formed by or include Ti, TiN, WN, W, Al, Co, Ni or Ru.

Figure 1T:
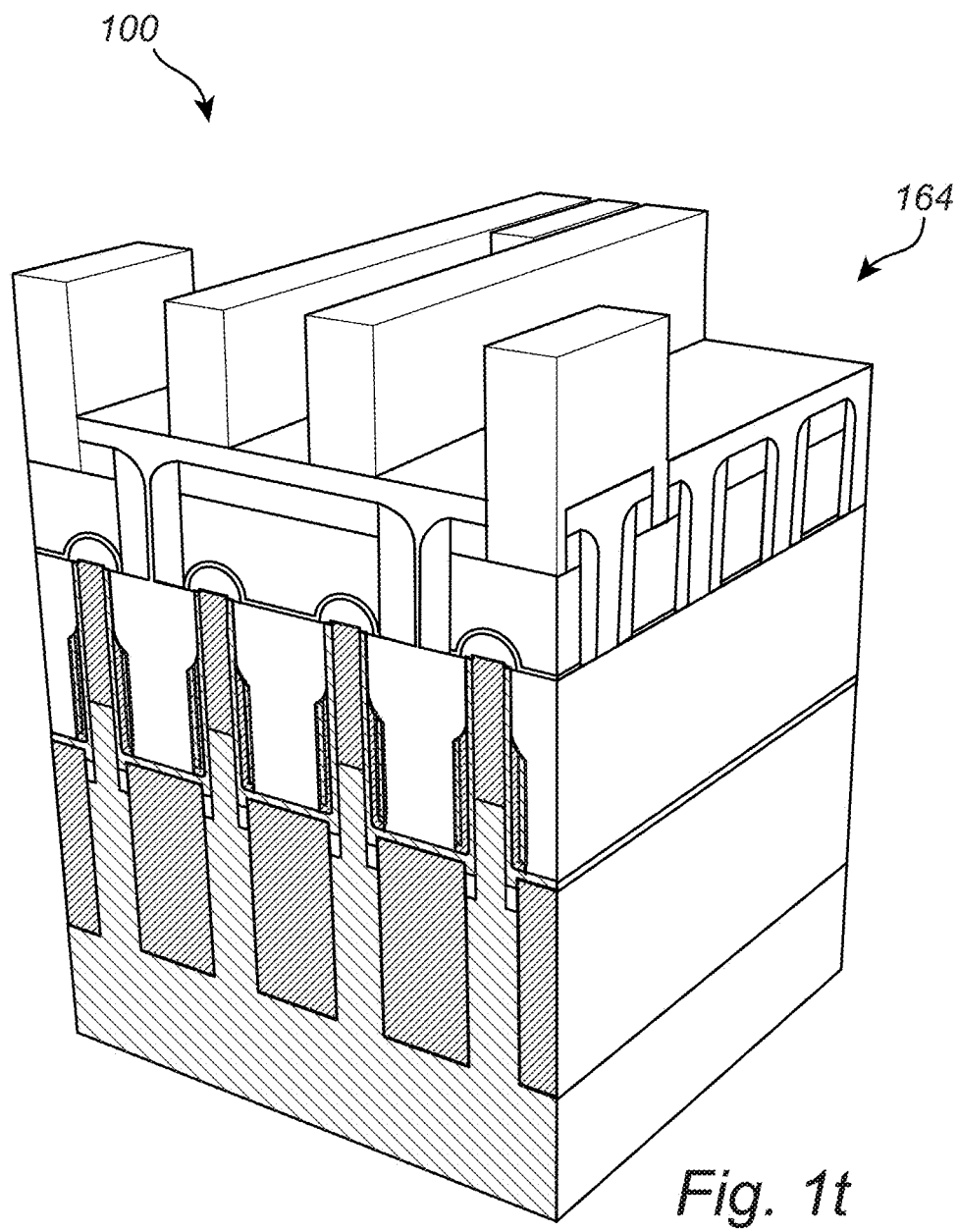

With reference to FIG. 1*t*, a contact pattern has been transferred into the conductive material layer 164 to form a set of discrete contacts 166 of the structure 100. The set of contacts 166 include gate contacts connected to gates 112 below the set of gate contact holes 162 and top contacts connected to top electrodes 138 below the set of contact holes 152.

During back-end-of-line processing routing layers may be formed above the structure 100. The routing layers may include one or more interconnection levels. The routing layers may include various lines connected to the gate contacts and top contacts. The connections between the contacts and the lines of the routing layers may be formed by forming vertical conductive vias in a manner which per se is known to the skilled person, for instance in a damascene style process.

It should be noted that the illustrated configuration of the contact pattern merely represents an example and that the pattern typically may vary depending on the underlying structure and the type of circuitry that is to be formed.

In the above the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A method of forming a vertical channel semiconductor device, the method comprising:
    forming on a semiconductor substrate a plurality of vertical channel structures;
    forming gates, each of the gates wrapping around one of the vertical channel structures;
    embedding the gates in a first dielectric layer and exposing top portions of the vertical channel structures;
    forming top electrodes on corresponding top portions of the vertical channel structures;
    forming sidewall etch barriers on sidewalls of each of the top electrodes;
    forming a second dielectric layer covering the first dielectric layer and the top electrodes;
    forming a set of gate contact holes, comprising:
        forming a gate contact mask layer on the second dielectric layer,
        forming openings in the gate contact mask layer, the openings defining locations of the gate contact holes, and
        etching using the gate contact mask layer a set of vertically extending gate contact holes through the first and second dielectric layers and selectively against the sidewall etch barriers, wherein each of the gate contact holes exposes one of the gates adjacent to one of the top electrodes; and
    filling the set of gate contact holes with a conductive material.

2. The method according to claim 1, wherein a width of at least one of the openings is such that etching the at least one of the openings exposes a corresponding sidewall etch barrier layer.

3. The method according to claim 1, wherein forming the sidewall etch barriers includes:
    forming a conformal etch barrier layer covering the first dielectric layer and the top electrodes; and
    anisotropically etching the etch barrier layer such that the etch barrier layer is removed from the first dielectric layer while remaining on the sidewalls of the top electrodes.

4. The method according claim 1, further comprising forming upper etch barriers on an upper surface of each of the top electrodes, wherein etching the set of vertically extending gate contact holes through the first and second dielectric layers comprises selectively etching against both the sidewall etch barriers and the upper etch barriers.

5. The method according to claim 1, wherein forming the top electrodes comprises:
forming a top electrode layer including at least a first conductive layer that covers the first dielectric layer and the top portions of the vertical channel structures; and
using a top electrode pattern as an etch mask to pattern the top electrode layer, thereby forming the top electrodes.

6. The method according to claim 5, wherein patterning the top electrode layer includes:
forming a top electrode mask layer on the top electrode layer;
forming the top electrode pattern in the top electrode mask layer, the top electrode pattern including a set of discrete mask portions, each mask portion of the pattern overlapping at least one top portion along a vertical direction; and
etching the top electrode layer in regions exposed by the mask portions of the top electrode pattern such that a set of discrete top electrodes are formed.

7. The method according to claim 1, wherein the first and the second dielectric layers are formed of the same material.

8. A method of forming a vertical channel semiconductor device, the method comprising:
forming on a semiconductor substrate a plurality of vertical channel structures;
forming gates, each of the gates wrapping around one of the vertical channel structures;
embedding the gates in a first dielectric layer and exposing top portions of the vertical channel structures;
forming top electrodes on corresponding top portions of the vertical channel structures, wherein forming the top electrodes comprises:
forming a top electrode layer including at least a first conductive layer that covers the first dielectric layer and the top portions of the vertical channel structures;
forming an etch barrier layer covering the top electrode layer; and
using a top electrode pattern as an etch mask to pattern the etch barrier layer and the top electrode layer, thereby forming the top electrodes and upper etch barriers;
forming sidewall etch barriers on sidewalls of each of the top electrodes;
forming a second dielectric layer covering the first dielectric layer and the top electrodes;
etching a set of vertically extending gate contact holes through the first and second dielectric layers and selectively against the sidewall etch barriers, wherein each of the gate contact holes exposes one of the gates adjacent to one of the top electrodes; and
filling the set of gate contact holes with a conductive material.

9. The method according to claim 8, wherein the top electrode layer further includes a second conductive layer formed on the first conductive layer, wherein at least the first conductive layer is formed as a conformal layer on the first dielectric layer and the top portions of the vertical channel structures.

10. A method of forming a vertical channel semiconductor device, the method comprising:
forming on a semiconductor substrate a plurality of vertical channel structures;
forming gates, each of the gates wrapping around one of the vertical channel structures;
embedding the gates in a first dielectric layer and exposing top portions of the vertical channel structures;
forming top electrodes on corresponding top portions of the vertical channel structures;
forming sidewall etch barriers on sidewalls of each of the top electrodes;
forming a second dielectric layer covering the first dielectric layer and the top electrodes;
etching a set of vertically extending gate contact holes through the first and second dielectric layers and selectively against the sidewall etch barriers, wherein each of the gate contact holes exposes one of the gates adjacent to one of the top electrodes;
etching a set of vertically extending top contact holes through the second dielectric layer, each of the top contact holes exposing a corresponding one of the top electrodes; and
filling the set of gate contact holes and the set of top contact holes with a conductive material by forming a conductive material layer covering the second dielectric layer and filling the set of gate contact holes and the set of top contact holes.

11. The method according to claim 10, further using a contact pattern as an etch mask to pattern the conductive material layer into a set of discrete contacts including gate contacts connected to gates below the set of gate contact holes and top contacts connected to top electrodes below the set of contact holes.

* * * * *